(12) United States Patent
Landman et al.

(10) Patent No.: US 12,241,933 B2
(45) Date of Patent: Mar. 4, 2025

(54) INTEGRATED CIRCUIT MARGIN MEASUREMENT FOR STRUCTURAL TESTING

(71) Applicant: PROTEANTECS LTD., Haifa (IL)

(72) Inventors: Evelyn Landman, Haifa (IL); Eyal Fayneh, Givatayim (IL); Shai Cohen, Haifa (IL); Alex Khazin, Nesher (IL)

(73) Assignee: PROTEANTECS LTD., Haifa (IL)

( * ) Notice: Subject to any disclaimer, the term of this patent is extended or adjusted under 35 U.S.C. 154(b) by 0 days.

(21) Appl. No.: 18/014,642

(22) PCT Filed: Jul. 5, 2021

(86) PCT No.: PCT/IL2021/050826
§ 371 (c)(1),
(2) Date: Jan. 5, 2023

(87) PCT Pub. No.: WO2022/009199
PCT Pub. Date: Jan. 13, 2022

(65) Prior Publication Data
US 2023/0258719 A1    Aug. 17, 2023

Related U.S. Application Data

(60) Provisional application No. 63/048,265, filed on Jul. 6, 2020.

(51) Int. Cl.
*G01R 31/3185* (2006.01)
*G01R 31/30* (2006.01)
*H03K 5/13* (2014.01)

(52) U.S. Cl.
CPC . *G01R 31/318594* (2013.01); *G01R 31/3016* (2013.01); *G01R 31/318536* (2013.01); *H03K 5/13* (2013.01)

(58) Field of Classification Search
CPC ........ G01R 31/318594; G01R 31/3016; G01R 31/318536; H03K 5/13
(Continued)

(56) References Cited

U.S. PATENT DOCUMENTS

| 4,555,663 A | 11/1985 | Shimizu |
| 5,548,539 A | 8/1996 | Vlach |

(Continued)

FOREIGN PATENT DOCUMENTS

| CN | 1886668 A | 12/2006 |
| CN | 101014991 A | 8/2007 |

(Continued)

OTHER PUBLICATIONS

Kan Takeuchi et al; "FEOL/BEOL wear-out estimator using stress-to-frequency conversion of voltage/temperature-sensitive ring oscillators for 28nm automotive MCUs"; IEEE, pp. 265-268, Oct. 20, 2016.

(Continued)

*Primary Examiner* — John J Tabone, Jr.
(74) *Attorney, Agent, or Firm* — The Roy Gross Law Firm, LLC; Roy Gross

(57) ABSTRACT

Structural testing of a semiconductor integrated circuit (IC), including scanning test patterns or test conditions into internal circuits of the semiconductor IC, for example from a tester device. A timing margin may be measured during the structural test. The margin is measured based on a characteristic of a comparison between a test signal path of the semiconductor IC and a delayed signal path, the delayed signal path being a signal of the test signal path delayed by a variable delay time. An output of the margin measurement sensor may be scanned out, for instance to the tester device.

20 Claims, 18 Drawing Sheets

(58) Field of Classification Search
USPC .... 714/745, 726, 782, 9, 731, 742; 327/530, 327/583, 8, 540, 545
See application file for complete search history.

(56) References Cited

U.S. PATENT DOCUMENTS

| | | | |
|---|---|---|---|
| 5,748,509 | A | 5/1998 | Fewster |
| 5,774,403 | A | 6/1998 | Clark, II et al. |
| 5,818,251 | A | 10/1998 | Intrater |
| 5,895,629 | A | 4/1999 | Russell et al. |
| 5,956,497 | A | 9/1999 | Ratzel et al. |
| 5,966,527 | A | 10/1999 | Krivokapic et al. |
| 6,172,546 | B1 | 1/2001 | Liu et al. |
| 6,182,253 | B1 | 1/2001 | Lawrence et al. |
| 6,486,716 | B1 | 11/2002 | Minami et al. |
| 6,586,921 | B1 | 7/2003 | Sunter |
| 6,683,484 | B1 | 1/2004 | Kueng et al. |
| 6,807,503 | B2 | 10/2004 | Ye et al. |
| 6,873,926 | B1 | 3/2005 | Diab |
| 6,882,172 | B1 | 4/2005 | Suzuki et al. |
| 6,948,388 | B1 | 9/2005 | Clayton et al. |
| 7,038,483 | B1 | 5/2006 | Suzuki et al. |
| 7,067,335 | B2 | 6/2006 | Weiner et al. |
| 7,254,507 | B2 | 8/2007 | Dosho et al. |
| 7,288,958 | B2 | 10/2007 | Takagi |
| 7,369,893 | B2 | 5/2008 | Gunderson |
| 7,443,189 | B2 | 10/2008 | Ramappa |
| 7,455,450 | B2 | 11/2008 | Liu et al. |
| 7,501,832 | B2 | 3/2009 | Spuhler et al. |
| 7,649,373 | B2 | 1/2010 | Tokunaga |
| 7,701,246 | B1 | 4/2010 | Plants et al. |
| 7,818,601 | B2 | 10/2010 | Laberge |
| 7,877,657 | B1 | 1/2011 | Miller et al. |
| 7,940,862 | B2 | 5/2011 | Tanaka et al. |
| 8,001,512 | B1 | 8/2011 | White |
| 8,086,978 | B2 | 12/2011 | Zhang et al. |
| 8,170,067 | B2 | 5/2012 | Zerbe et al. |
| 8,279,976 | B2 | 10/2012 | Lin et al. |
| 8,310,265 | B2 | 11/2012 | Zjajo et al. |
| 8,365,115 | B2 | 1/2013 | Liu et al. |
| 8,418,103 | B2 | 4/2013 | Wang et al. |
| 8,479,130 | B1 | 7/2013 | Zhang et al. |
| 8,633,722 | B1 | 1/2014 | Lai |
| 8,825,158 | B2 | 9/2014 | Swerdlow |
| 8,996,937 | B2 | 3/2015 | Jain et al. |
| 9,275,706 | B2 | 3/2016 | Tam |
| 9,424,952 | B1 | 8/2016 | Seok et al. |
| 9,490,787 | B1 | 11/2016 | Kho et al. |
| 9,536,038 | B1 | 1/2017 | Quinton et al. |
| 9,564,883 | B1 | 2/2017 | Quinton et al. |
| 9,564,884 | B1 * | 2/2017 | Quinton ............... H03K 3/0375 |
| 9,632,126 | B2 | 4/2017 | Yoon et al. |
| 9,714,966 | B2 | 7/2017 | Chen et al. |
| 9,760,672 | B1 | 9/2017 | Taneja et al. |
| 9,791,834 | B1 | 10/2017 | Nassar et al. |
| 9,954,455 | B2 | 4/2018 | Lin et al. |
| 9,977,078 | B2 | 5/2018 | Loke et al. |
| 9,991,879 | B2 | 6/2018 | Huang |
| 10,490,547 | B1 | 11/2019 | Ali et al. |
| 10,509,104 | B1 | 12/2019 | Dato |
| 10,530,347 | B2 | 1/2020 | Tang et al. |
| 11,036,266 | B2 | 6/2021 | Srivastava et al. |
| 11,081,193 | B1 | 8/2021 | Tang |
| 11,385,282 | B2 * | 7/2022 | Landman ......... G01R 31/31937 |
| 11,409,323 | B2 | 8/2022 | Herberholz et al. |
| 11,841,395 | B2 * | 12/2023 | Landman ........... G01R 31/2881 |
| 12,013,800 | B1 | 6/2024 | Fayneh et al. |
| 2004/0009616 | A1 | 1/2004 | Huisman et al. |
| 2004/0015793 | A1 | 1/2004 | Saxena et al. |
| 2004/0230385 | A1 | 11/2004 | Bechhoefer et al. |
| 2004/0230396 | A1 | 11/2004 | Ye et al. |
| 2005/0053162 | A1 | 3/2005 | Goishi |
| 2005/0104175 | A1 | 5/2005 | Itano et al. |
| 2005/0114056 | A1 | 5/2005 | Patel et al. |
| 2005/0134350 | A1 | 6/2005 | Huang et al. |
| 2005/0134394 | A1 | 6/2005 | Liu |
| 2005/0154552 | A1 | 7/2005 | Stroud et al. |
| 2005/0285646 | A1 | 12/2005 | Rashid |
| 2006/0049886 | A1 | 3/2006 | Agostinelli, Jr. et al. |
| 2006/0224374 | A1 | 10/2006 | Kwon et al. |
| 2007/0110199 | A1 | 5/2007 | Momtaz et al. |
| 2007/0182456 | A1 | 8/2007 | Agarwal et al. |
| 2007/0288183 | A1 | 12/2007 | Bulkes et al. |
| 2008/0071489 | A1 | 3/2008 | Wissel |
| 2008/0074521 | A1 | 3/2008 | Olsen |
| 2008/0144243 | A1 | 6/2008 | Mariani et al. |
| 2008/0147355 | A1 | 6/2008 | Fields et al. |
| 2008/0183409 | A1 | 7/2008 | Roberts et al. |
| 2008/0186001 | A1 | 8/2008 | Singh et al. |
| 2008/0186044 | A1 | 8/2008 | Singh |
| 2008/0216033 | A1 | 9/2008 | Bucossi et al. |
| 2008/0231310 | A1 | 9/2008 | Vijayaraghavan et al. |
| 2008/0262769 | A1 | 10/2008 | Kadosh et al. |
| 2009/0027077 | A1 | 1/2009 | Vijayaraghavan et al. |
| 2009/0076753 | A1 | 3/2009 | Vijayaraghavan et al. |
| 2009/0096495 | A1 | 4/2009 | Keigo |
| 2009/0183043 | A1 | 7/2009 | Niwa |
| 2009/0222775 | A1 | 9/2009 | Idgunji et al. |
| 2009/0230947 | A1 | 9/2009 | Sumita |
| 2009/0244998 | A1 | 10/2009 | Kim |
| 2009/0273550 | A1 | 11/2009 | Vieri et al. |
| 2009/0278576 | A1 | 11/2009 | Chakravarty |
| 2009/0306953 | A1 | 12/2009 | Liu |
| 2010/0153896 | A1 | 6/2010 | Sewall et al. |
| 2010/0251046 | A1 | 9/2010 | Mizuno et al. |
| 2010/0253382 | A1 | 10/2010 | Wang et al. |
| 2011/0093830 | A1 | 4/2011 | Chen et al. |
| 2011/0102091 | A1 | 5/2011 | Yeric |
| 2011/0109377 | A1 | 5/2011 | Fujibe et al. |
| 2011/0113298 | A1 | 5/2011 | Van Den Eijnden |
| 2011/0169537 | A1 | 7/2011 | Ma |
| 2011/0175658 | A1 | 7/2011 | Nomura |
| 2011/0187433 | A1 | 8/2011 | Baumann et al. |
| 2011/0267096 | A1 | 11/2011 | Chlipala et al. |
| 2011/0295403 | A1 | 12/2011 | Higuchi et al. |
| 2011/0315986 | A1 | 12/2011 | Kaneda et al. |
| 2012/0025846 | A1 | 2/2012 | Minas et al. |
| 2012/0038388 | A1 | 2/2012 | Tseng et al. |
| 2012/0051395 | A1 | 3/2012 | Chen et al. |
| 2012/0063524 | A1 | 3/2012 | Stott et al. |
| 2012/0074973 | A1 | 3/2012 | Baldwin |
| 2012/0163074 | A1 | 6/2012 | Franca-Neto |
| 2012/0170616 | A1 | 7/2012 | Tsai et al. |
| 2012/0187991 | A1 | 7/2012 | Sathe et al. |
| 2012/0212246 | A1 | 8/2012 | Benjamin et al. |
| 2012/0217976 | A1 | 8/2012 | Clarkson |
| 2012/0221906 | A1 | 8/2012 | Shetty et al. |
| 2012/0242490 | A1 | 9/2012 | Ramaswami |
| 2013/0088256 | A1 | 4/2013 | Chlipala et al. |
| 2013/0226491 | A1 | 8/2013 | Miguelanez, II et al. |
| 2013/0241690 | A1 | 9/2013 | Wallace et al. |
| 2013/0293270 | A1 | 11/2013 | Lee et al. |
| 2013/0335875 | A1 | 12/2013 | Baumann |
| 2014/0132293 | A1 | 5/2014 | Abadir et al. |
| 2014/0132315 | A1 | 5/2014 | Sharma et al. |
| 2014/0143586 | A1 | 5/2014 | Dalumi et al. |
| 2014/0184243 | A1 | 7/2014 | Iyer et al. |
| 2014/0254734 | A1 | 9/2014 | Abdelmoneum et al. |
| 2015/0061707 | A1 | 3/2015 | Balasubramanian |
| 2015/0077136 | A1 | 3/2015 | Li |
| 2015/0121158 | A1 | 4/2015 | Wang et al. |
| 2015/0199223 | A1 | 7/2015 | Banerjee et al. |
| 2015/0332451 | A1 | 11/2015 | Amzaleg et al. |
| 2015/0355033 | A1 | 12/2015 | Zhang et al. |
| 2015/0365049 | A1 | 12/2015 | Ozawa et al. |
| 2016/0033574 | A1 | 2/2016 | Serrer et al. |
| 2016/0042784 | A1 | 2/2016 | Rim et al. |
| 2016/0072511 | A1 | 3/2016 | Maekawa |
| 2016/0087643 | A1 | 3/2016 | Nozaki |
| 2016/0125434 | A1 | 5/2016 | Kohn et al. |
| 2016/0131708 | A1 | 5/2016 | Huang et al. |
| 2016/0153840 | A1 | 6/2016 | Huang et al. |
| 2016/0156176 | A1 | 6/2016 | Kunz, Jr. et al. |
| 2016/0164503 | A1 | 6/2016 | Kim et al. |

(56) References Cited

U.S. PATENT DOCUMENTS

| | | |
|---|---|---|
| 2016/0203036 A1 | 7/2016 | Mezic et al. |
| 2016/0254804 A1 | 9/2016 | Meng |
| 2017/0038265 A1 | 2/2017 | Abdelmoneum et al. |
| 2017/0093399 A1 | 3/2017 | Atkinson et al. |
| 2017/0160339 A1 | 6/2017 | Jenkins |
| 2017/0179173 A1 | 6/2017 | Mandai et al. |
| 2017/0199089 A1 | 7/2017 | Fritchman et al. |
| 2017/0199228 A1 | 7/2017 | Hsieh et al. |
| 2017/0214516 A1 | 7/2017 | Rivaud et al. |
| 2017/0329391 A1 | 11/2017 | Jaffari et al. |
| 2017/0344102 A1 | 11/2017 | Kolla et al. |
| 2017/0345490 A1 | 11/2017 | Yoshimoto et al. |
| 2017/0364818 A1 | 12/2017 | Wu et al. |
| 2018/0034549 A1 | 2/2018 | Kikuchi |
| 2018/0109245 A1 | 4/2018 | Takagi |
| 2018/0183413 A1 | 6/2018 | Wong et al. |
| 2018/0365974 A1 | 12/2018 | Haas et al. |
| 2019/0019096 A1 | 1/2019 | Yoshida et al. |
| 2019/0117122 A1 | 4/2019 | Kurachi et al. |
| 2019/0305074 A1 | 10/2019 | Kande et al. |
| 2020/0028514 A1 | 1/2020 | Hanke et al. |
| 2020/0203333 A1 | 6/2020 | Chen et al. |
| 2020/0209070 A1 | 7/2020 | Tang et al. |
| 2020/0313664 A1 | 10/2020 | Azam et al. |
| 2022/0260630 A1 | 8/2022 | Fayneh et al. |
| 2022/0349935 A1 | 11/2022 | Fayneh et al. |
| 2023/0009637 A1* | 1/2023 | Fayneh ............ G11C 29/028 |
| 2023/0098071 A1 | 3/2023 | Chonnad et al. |
| 2023/0258719 A1* | 8/2023 | Landman ....... G01R 31/318536 714/731 |

FOREIGN PATENT DOCUMENTS

| | | |
|---|---|---|
| CN | 101241429 A | 8/2008 |
| CN | 101344898 A | 1/2009 |
| CN | 101915625 B | 7/2012 |
| CN | 102273077 B | 9/2014 |
| CN | 102422169 A | 11/2014 |
| CN | 105210188 A | 12/2015 |
| CN | 106959400 A | 7/2017 |
| CN | 108534866 A | 9/2018 |
| CN | 113466670 A | 10/2021 |
| DE | 102007002253 A1 | 7/2007 |
| DE | 102014216786 B3 | 10/2015 |
| DE | 102012219971 A1 | 7/2016 |
| EP | 962991 A1 | 12/1999 |
| EP | 1262755 A1 | 12/2002 |
| EP | 2006784 A1 | 12/2008 |
| EP | 2060924 A1 | 5/2009 |
| EP | 2413150 A1 | 2/2012 |
| EP | 2770313 A1 | 8/2014 |
| JP | S57116228 A | 7/1982 |
| JP | 2000215693 A | 8/2000 |
| JP | 2002243800 A | 8/2002 |
| JP | 2008147245 A | 6/2008 |
| JP | 2009065533 A | 3/2009 |
| JP | 2012037238 A | 2/2012 |
| JP | 2009021348 A | 7/2013 |
| JP | 2016111563 A | 6/2016 |
| KR | 101232207 B1 | 2/2013 |
| KR | 2013110989 A | 10/2013 |
| KR | 20150073199 A | 6/2015 |
| TW | 200914841 A | 4/2009 |
| TW | 201614256 A | 3/2016 |
| TW | 201709669 A | 3/2017 |
| WO | 2005080099 A1 | 9/2005 |
| WO | 2013070218 A1 | 5/2013 |
| WO | 2013027739 A1 | 3/2015 |
| WO | 2019097516 A1 | 5/2019 |
| WO | 2019102467 A1 | 5/2019 |
| WO | 2019135247 A1 | 7/2019 |
| WO | 2019202595 A1 | 10/2019 |
| WO | 2019244154 A1 | 12/2019 |
| WO | 2020141516 A1 | 7/2020 |
| WO | 2020230130 A1 | 11/2020 |
| WO | 2021019539 A1 | 2/2021 |
| WO | 2021111444 A1 | 6/2021 |
| WO | 2021214562 A1 | 10/2021 |
| WO | 2022/009199 A1 | 1/2022 |
| WO | 2022215076 A1 | 10/2022 |
| WO | 2023238128 A1 | 12/2023 |
| WO | 2024/166103 A1 | 8/2024 |

OTHER PUBLICATIONS

Kan Takeuchi et al; "Wear-out stress monitor utilising temperature and voltage sensitive ring oscillators" IET Circuits, Devices & Systems. vol. 12 No. 2, pp. 182-188, Jan. 15, 2018.

Kan Takeuchi et al; "Experimental Implementation of 8.9Kgate Stress Monitor in 28nm MCU along with Safety Software Library for IoT Device Maintenance"; IEEE International Reliability Physics Symposium (IRPS). Mar. 31, 2019.

Dan Ernst et al; "Razor: Circuit-Level Correction of Timing Errors for Low-Power Operation"; IEEE Computer Society. Nov. 30, 2004.

Dan Ernst et al; "Razor: A Low-Power Pipeline Based on Circuit-Level Timing Speculation"; Appears in the 36th Annual International Symposium on Microarchitecture (Micro-36). Dec. 1, 2003.

James P. Hofmeister, et al, "Ball Grid Array (BGA) Solder Joint Intermittency Detection: SJ BIST™", IEEE Aerospace Conference Proceedings, Apr. 2008, paper #1148, Version 1.

Paulheim H, Meusel R. "A decomposition of the outlier detection problem into a set of supervised learning problems", Machine Learning, Sep. 2015, vol. 100 Issue 2, pp. 509-531.

Zhang L, Marron JS, Shen H, Zhu Z., "Singular value decomposition and its visualization", Journal of Computational and Graphical Statistics, Dec. 2007, vol. 6 Issue 4, pp. 833-854.

Shinkai, Ken-ichi et al. "Device-parameter estimation with on-chip variation sensors considering random variability."; In 16th Asia and South Pacific Design Automation Conference (ASP-DAC 2011), pp. 683-688. IEEE, Jan. 25, 2011.

Weiwei Shan et al. "An improved timing error prediction monitor for wide adaptive frequency scaling"; IEICE Electronics Express, vol. 14, No. 21, pp. 1-6, Oct. 20, 2017.

Agilent Technologies; "Clock Jitter Analysis with femto-second resolution"; Jan. 1, 2008.

Yousuke Miyake et al; "Temperature and voltage estimation using ring-oscillator-based monitor for field test"; IEEE 23rd Asian Test Symposium; pp. 156-161, Nov. 16, 2014.

Basab Datta at al; "Analysis of a Ring Oscillator Based on Chip Thermal Sensor in 65nm Technology"; Online at: https://web.archive.org/web/20140328234617/http://www-unix.ecs.umass.edu/~dkumar/lab4_658_report/lab4_report.htm; Sep. 5, 2018.

Tilman Wolf et al; "Collaborative Monitors for Embedded System Security". Jan. 1, 2006.

Sandeep Kumar Samal et al; "Machine Learning Based Variation Modeling and Optimization for 3D ICs"; J. Inf. Commun. Converg. Eng. 14(4): 258-267, Dec. 2016.

Yin-Nien Chen et al; "Impacts of Work Function Variation and Line-Edge Roughness on TFET and FinFET Devices and 32-Bit CLA Circuits"; J. Low Power Electron. Appl. 2015, 5, 101-115. May 21, 2015.

Yong Zhao et al; "A Genetic Algorithm Based Remaining Lifetime Prediction for a VLIW Processor Employing Path Delay and IDDX Testing"; IEEE; Apr. 12, 2016.

Vivek S Nandakumar et al, "Statistical static timing analysis flow for transistor level macros in a microprocessor"; 2010, 11th International Symposium on Quality Electronic Design (ISQED), pp. 163-170, Mar. 22, 2010.

Jing Li et al, "Variation Estimation and Compensation Technique in Scaled LTPS TFT Circuits for Low-Power Low-Cost Applications"; IEEE Transactions on Computer-Aided Design of Integrated Circuits and Systems, vol. 28(1): 46-59, Jan. 1, 2009.

Xie Qing et al "Variation-Aware Joint Optimization of the Supply Voltage and Sleep Transistor Size for 7nm FinFET Technology"; 2014 IEEE 32nd international conference on computer design, pp. 380-385, Oct. 19, 2014.

(56) References Cited

OTHER PUBLICATIONS

Rebaud B et al ,"Timing slack monitoring under process and environmental variations: Application to a DSP performance optimization"; Microelectronics Journal vol. 42 Issue 5, pp. 718-732, Feb. 8, 2011.
Dierickx B et al, "Propagating variability from technology to system Level"; Physics of Semiconductor Devices, pp. 74-79, Dec. 16, 2007.
Zheng K., "A Comparison of Digital Droop Detection Techniques in ASAP7 FinFET"; Research Review. Sep. 2019.
Hongge Chen, "Novel Machine Learning Approaches for Modeling Variations in Semiconductor Manufacturing," Master thesis, Jun. 2017.
PCT Search Report for International Application No. PCT/IL2021/050826 mailed Nov. 14, 2021, 3 pp.
PCT Written Opinion for International Application No. PCT/IL2021/050826 mailed Nov. 14, 2021, 5 pp.
Nidhal Selmane, Shivam Bhasin, Sylvain Guilley, Tarik Graba, Jean-Luc Danger. "WDDL is Protected Against Setup Time Violation Attacks." CHES, Sep. 2009, Lausanne, Switzerland. pp. 73-83. DOI:10.1109/FDTC.2009.40.
Nidhal Selmane, Shivam Bhasin, Sylvain Guilley, Jean-Luc Danger. "Security evaluation of application-specific integrated circuits and field programmable gate arrays against setup time violation attacks." IET Inf. Secur., 2011, vol. 5, Iss. 4, pp. 181-190. doi: 10.1049/iet-ifs.2010.0238.
Jianfeng Zhang et al, "Parameter Variation Sensing and Estimation in Nanoscale Fabrics"; Journal of Parallel and Distributed Computing; vol. 74, Issue 6, pp. 2504-2511, Jun. 1, 2014. https://doi.org/10.1016/j.jpdc.2013.08.005.
I. A. K. M. Mahfuzul et al, "Variation-sensitive monitor circuits for estimation of Die-to-Die process variation"; 2011 IEEE ICMTS International Conference on Microelectronic Test Structures, Amsterdam, Netherlands; pp. 153-157, Apr. 4-7, 2011. doi: 10.1109/ICMTS.2011.5976878.
Ying Qiao et al, "Variability-aware compact modeling and statistical circuit validation on SRAM test array"; Proceedings of the SPIE, vol. 9781, Design-Process-Technology Co-optimization for Manufacturability X, Mar. 16, 2016. DOI: 10.1117/12.2219428.
David Herres, "The Eye Diagram: What is it and why is it used?"; Online at: https://www.testandmeasurementtips.com/basics-eye-diagrams/, Aug. 16, 2016.
Yu-Chuan Lin et al, "A 10-GB/s Eye-Opening Monitor Circuit for Receiver Equalizer Adaptations in 65-nm CMOS;" in IEEE Transactions on Very Large Scale Integration (VLSI) Systems, vol. 28, No. 1, pp. 23-34, Jan. 2020. doi: 10.1109/TVLSI.2019.2935305.
Mridul Agarwal et al, "Circuit Failure Prediction and Its Application to Transistor Aging"; 5th IEEE VLSI Test Symposium (VTS'07), pp. 277-286, May 6-10, 2007. doi: 10.1109/VTS.2007.22.
Keith A. Bowman et al, "Energy-Efficient and Metastability-Immune Resilient Circuits for Dynamic Variation Tolerance"; IEEE Journal of Solid-State Circuits vol. 44, Issue 1, pp. 49-63, Jan. 2009. doi: 10.1109/JSSC.2008.2007148.
Shidhartha Das et al, "A Self-Tuning DVS Processor Using Delay-Error Detection and Correction"; IEEE Journal of Solid-State Circuits; vol. 41, Issue 4, pp. 792-804, Apr. 2006. doi: 10.1109/JSSC.2006.870912.
Shidhartha Das et al, "RazorII: In Situ Error Detection and Correction for PVT and SER Tolerance" 2008 IEEE International Solid-State Circuits Conference—Digest of Technical Papers, Feb. 3-7, 2008. doi: 10.1109/JSSC.2008.2007145.
Ramyanshu Datta et al, "On-Chip Delay Measurement for Silicon Debug"; GLSVLSI '04: Proceedings of the 14th ACM Great Lakes symposium on VLSI; pp. 145-148, Apr. 26-28, 2004. https://doi.org/10.1145/988952.988988.
Alan Drake et al, "A Distributed Critical-Path Timing Monitor for a 65nm High-Performance Microprocessor"; 2007 IEEE International Solid-State Circuits Conference. Digest of Technical Papers; Feb. 11-15, 2007. doi: 10.1109/ISSCC.2007.373462.

Matthias Eireiner et al, "In-Situ Delay Characterization and Local Supply Voltage Adjustment for Compensation of Local Parametric Variations"; IEEE Journal of Solid-State Circuits; vol. 42, Issue 7, pp. 1583-1592, Jul. 2007. doi: 10.1109/JSSC.2007.896695.
Matthew Fojtik et al, "Bubble Razor: An architecture-independent approach to timing-error detection and correction"; 2012 IEEE International Solid-State Circuits Conference; Feb. 19-23, 2012. doi: 10.1109/ISSCC.2012.6177103.
Matthew Fojtik et al, "Bubble Razor: Eliminating Timing Margins in an ARM Cortex-M3 Processor in 45 nm CMOS Using Architecturally Independent Error Detection and Correction"; IEEE Journal of Solid-State Circuits; vol. 48, Issue 1, pp. 66-81, Jan. 2013. doi: 10.1109/JSSC.2012.2220912.
Piero Franco et al, "On-Line Delay Testing of Digital Circuits"; Proceedings of IEEE VLSI Test Symposium; Apr. 25-28, 1994. doi: 10.1109/VTEST.1994.292318.
V. Huard et al, "Adaptive Wearout Management with in-situ aging monitors"; 2014 IEEE International Reliability Physics Symposium; Jun. 1-5, 2014. pp. 6B.4.1-6B.4.11, doi: 10.1109/IRPS.2014.6861106.
Liangzhen Lai et al, "SlackProbe: A Flexible and Efficient In Situ Timing Slack Monitoring Methodology"; IEEE Transactions on Computer-Aided Design of Integrated Circuits and Systems; vol. 33, Issue 8, pp. 1168-1179, Aug. 2014. doi: 10.1109/TCAD.2014.2323195.
M. Saliva et al, "Digital Circuits Reliability with In-Situ Monitors in 28nm Fully Depleted SOI"; 2015 Design, Automation Mar. 9-13, 2015. doi: 10.7873/Date.2015.0238.
Martin Wirnshofer et al, "A Variation-Aware Adaptive Voltage Scaling Technique based on In-Situ Delay Monitoring"; 14th IEEE International Symposium on Design and Diagnostics of Electronic Circuits and Systems; pp. 261-266, Apr. 13-15, 2011. doi: 10.1109/DDECS.2011.5783090.
Martin Wirnshofer et al, "An Energy-Efficient Supply Voltage Scheme using In-Situ Pre-Error Detection for on-the-fly Voltage Adaptation to PVT Variations"; 2011 International Symposium on Integrated Circuits; pp. 94-97, Dec. 12-14, 2011. doi: 10.1109/ISICir.2011.6131888.
Martin Wirnshofer et al, "On-line supply voltage scaling based on in situ delay monitoring to adapt for PVTA variations"; Journal of Circuits, Systems and Computers; vol. 21, No. 08, Mar. 7, 2012. doi: 10.1142/S0218126612400270.
S. Mhira et al, "Dynamic Adaptive Voltage Scaling in Automotive environment"; 2017 IEEE International Reliability Physics Symposium (IRPS); pp. 3A-4.1-3A-4.7, Apr. 2-6, 2017. doi: 10.1109/IRPS.2017.7936279.
A. Benhassain et al, "Early failure prediction by using in-situ monitors: Implementation and application results"; Online at: https://ceur-ws.org/Vol-1566/Paper6.pdf, Mar. 18, 2016.
Charles R. Lefurgy et al, "Active Management of Timing Guardband to Save Energy in Power7"; 2011 44th Annual IEEE/ACM International Symposium on Microarchitecture (Micro); pp. 1-11; Dec. 3-7, 2011.
C. R. Lefurgy et al., "Active Guardband Management in Power7+ to Save Energy and Maintain Reliability"; in IEEE Micro, vol. 33, No. 4, pp. 35-45, Jul.-Aug. 2013. doi: 10.1109/MM.2013.52.
B. Zandian et al, "Cross-layer resilience using wearout aware design flow"; 2011 IEEE/IFIP 41st International Conference on Dependable Systems & Networks (DSN), pp. 279-290, Jun. 27-30, 2011. doi: 10.1109/DSN.2011.5958226.
M. Cho et al., "Postsilicon Voltage Guard-Band Reduction in a 22 nm Graphics Execution Core Using Adaptive Voltage Scaling and Dynamic Power Gating"; in IEEE Journal of Solid-State Circuits, vol. 52, No. 1, pp. 50-63, Jan. 4, 2017. doi: 10.1109/JSSC.2016.2601319.
W. Shan et al, "Timing error prediction based adaptive voltage scaling for dynamic variation tolerance"; 2014 IEEE Asia Pacific Conference on Circuits and Systems (APCCAS), pp. 739-742, Nov. 17-20, 2014. doi: 10.1109/APCCAS.2014.7032887.
J. Li et al, "Robust and in-situ self-testing technique for monitoring device aging effects in pipeline circuits"; 2014 51st ACM/EDAC/IEEE Design Automation Conference (DAC), pp. 1-6, Jun. 1-5, 2014.

(56) References Cited

OTHER PUBLICATIONS

X. Shang et al, "A 0.44V-1.1V 9-transistor transition-detector and half-path error detection technique for low power applications"; 2017 IEEE Asian Solid-State Circuits Conference (A-SSCC), pp. 205-208, Nov. 6-8, 2017. doi: 10.1109/ASSCC.2017.8240252.

Liangzhen Lai et al, "Accurate and inexpensive performance monitoring for variability-aware systems"; 2014 19th Asia and South Pacific Design Automation Conference (ASP-DAC), pp. 467-473, Jan. 20-23, 2014. doi: 10.1109/ASPDAC.2014.6742935.

Martin Wirnshofer et al, "Adaptive voltage scaling by in-situ delay monitoring for an image processing circuit"; 2012 IEEE 15th International Symposium on Design and Diagnostics of Electronic Circuits & Systems (DDECS), pp. 205-208, Apr. 18-20, 2012. doi: 10.1109/DDECS.2012.6219058.

Youhua Shi et al, "Suspicious timing error prediction with in-cycle clock gating"; International Symposium on Quality Electronic Design (ISQED), pp. 335-340, Mar. 4-6, 2013. doi: 10.1109/ISQED.2013.6523631.

Youhua Shi et al, "In-situ timing monitoring methods for variation-resilient designs"; 2014 IEEE Asia Pacific Conference on Circuits and Systems (APCCAS), pp. 735-738, Nov. 17-20, 2014. doi: 10.1109/APCCAS.2014.7032886.

Jongho Kim et al., "Adaptive delay monitoring for wide voltage-range operation"; 2016 Design, Automation & Test in Europe Conference & Exhibition, pp. 511-516, Mar. 14-18, 2016. DOI:10.3850/9783981537079 0330.

Xiaobin Yuan et al., "Design Considerations for Reconfigurable Delay Circuit to Emulate System Critical Paths"; in IEEE Transactions on Very Large Scale Integration (VLSI) Systems, vol. 23, No. 11, pp. 2714-2718, Nov. 2015. doi: 10.1109/TVLSI.2014.2364785.

\* cited by examiner

INTEGRATED CIRCUIT MARGIN MEASUREMENT FOR STRUCTURAL TESTING

CROSS-REFERENCE TO RELATED APPLICATIONS

This application is a National Phase of PCT Patent Application No. PCT/IL2021/050826 having International filing date of Jul. 5, 2021, which claims priority to U.S. Provisional Patent Application No. 63/048,265, filed Jul. 6, 2020, and entitled "Integrated Circuit Margin Measurement for Structural Testing," the contents of which are incorporated herein by reference in their entirety.

FIELD OF THE INVENTION

The invention relates to the field of integrated circuits.

BACKGROUND

Integrated circuits (ICs) may include analog and digital electronic circuits on a flat semiconductor substrate, such as a silicon wafer. Microscopic transistors are printed onto the substrate using photolithography techniques to produce complex circuits of billions of transistors in a very small area, making modern electronic circuit design using ICs both low cost and high performance. ICs are produced in assembly lines of factories, termed foundries, that have commoditized the production of ICs, such as complementary metal-oxide-semiconductor (CMOS) ICs. Digital ICs contain billions of transistors arranged in functional and/or logical units on the wafer, with data paths interconnecting the functional units that transfer data values between the functional units.

As used herein, the term "data path" means a parallel series of electronic connections, or paths, for transferring data signals between functional/logical units of an IC, and each data path may include a specific number of bit paths, such as 64, 128, 256, or the like. During the IC design process, the timing of the functional units is arranged so that each functional unit may usually complete the required processing of that unit within a single clock cycle. A safety factor may be used to account for manufacturing differences of individual ICs and possible changes, such as degradations, over the planned lifetime of the IC.

The degrading of an IC's transistors over time is termed aging. For example, the degradation of transistors over time leads slowly to decreased switching speeds, and may even result in outright circuit failures, when they exceed the design safety factors. Usually, the design process incorporates these delays into the design such that the ICs will not fail during their normal lifetime, but environmental and usage conditions (such as heat, voltage, current, humidity, and/or the like) may accelerate the aging process.

IC transistors, such as bipolar transistors, metal-oxide semiconductor field-effect transistors (MOSFETs), and/or the like, may be used in digital ICs and may function as electrical switches. For example, a MOSFET may have four terminals, such as the body, the gate, the source, and the drain, yet typically the source and body are electrically connected. The voltage applied to the gate may determine the amount of current that flows between the source and drain. A thin layer of dielectric material electrically insulates the gate, and the electric field applied across the gate may alter the conductivity of the underlying semiconductor channel between the source and drain.

With use, charge carriers (such as electrons for negative, or n-channel, MOSFETs, or holes for positive, or p-channel, MOSFETs) that have more energy than the average charge carrier may stray out of the conductive channel between the source and drain, and become trapped in the insulating dielectric. This process, termed hot-carrier injection (HCI), may eventually build up electric charge within the dielectric layer, and thus increase the voltage needed to operate the transistor. As the threshold voltage increases, the transistor switching delay may become larger.

Another aging mechanism occurs when voltage is applied to the gate, a phenomenon termed "bias temperature instability" (BTI). BTI may cause a buildup of charge in the dielectric, among other issues, though, some of this effect spontaneously disappears after that gate voltage is removed. This recovery occurs within a few microseconds, making it difficult to observe when a transistor is stressed and then the resulting effects are measured only after the stress is removed.

A further aging mechanism comes into play when voltage applied to the gate creates electrically-active defects, known as "traps," within the dielectric. When traps become too numerous, these charge traps may join and form an outright short circuit between the gate and the current channel. This kind of failure is termed "oxide breakdown," or "time-dependent dielectric breakdown." Unlike the other aging mechanisms, which cause a gradual decline in performance, the breakdown of the dielectric may lead to a catastrophic failure of the transistor, causing the IC to malfunction.

Additionally, a phenomenon called electromigration may damage the copper or aluminum connections that tie transistors together or link them to the outside world. Electromigration may occur when a surge of current knocks metal atoms loose from the electrical connections and may cause them to flow with the electrons. This depletes the metal of some atoms upstream, while causing a buildup of metal downstream. The upstream thinning of the metal increases the electrical resistance of the connection, sometimes becoming an open circuit. The downstream deposition may cause the metal to bulge out of its designated track.

Another reliability related issue in ICs is a phenomenon called "stress migration," which involves flow of metal atoms under the influence of mechanical stress.

Additionally, any defect, such as unmodeled phenomenon, random manufacturing defects, and/or the like, may cause a timing degradation of a signal path over time. Some defects may not appear during testing, verification, initial operation, and/or the like, for example, the die/IC/product may pass all the screening procedures at the testing stage. For example, a via that includes a manufacturing defects, such as less that complete metal coverage, will increase its resistance over time and at some point, causes a timing failure of a logic path. For example, random manufacturing defects may appear anywhere on the IC, and incorporate a large variety of types and levels of defects, so designs may not be able to incorporate safety factors to mitigate these defects.

The foregoing examples of the related art and limitations related therewith are intended to be illustrative and not exclusive. Other limitations of the related art will become apparent to those of skill in the art upon a reading of the specification and a study of the figures.

SUMMARY

The following embodiments and aspects thereof are described and illustrated in conjunction with systems, tools and methods which are meant to be exemplary and illustrative, not limiting in scope.

There is provided, in accordance with some embodiments, a method for testing a semiconductor integrated circuit (IC). The method comprises: performing a structural test on the semiconductor IC, by scanning test patterns into internal circuits of the semiconductor IC; and measuring a margin during the structural test, the margin being measured based on a characteristic of a comparison between a test signal path of the semiconductor IC and a delayed signal path, the delayed signal path being a signal of the test signal path delayed by a variable delay time.

In embodiments, the step of measuring comprises: receiving, at a signal path combiner, a plurality of signal paths of the semiconductor IC; and combining the received plurality of signal paths of the semiconductor IC to provide the test signal path.

In embodiments, the step of measuring the margin comprises identifying a delay time threshold based on multiple comparisons between the test signal path of the semiconductor IC and the delayed signal path for different delay times.

In embodiments, the step of measuring a margin is performed by a sensor on the semiconductor IC forming part of the internal circuits of the semiconductor IC used for the structural test, the method further comprising: scanning out data on the measured characteristic of a delay from the internal circuits of the semiconductor IC used for the structural test.

In embodiments, the sensor comprises a data register forming part of a scan chain of the structural test, the method further comprising: configuring the structural test by resetting the data register; storing the measured characteristic of a delay in the data register; and scanning out the measured characteristic of a delay from the data register.

In embodiments, the data register forming part of a scan chain of the structural test is a first data register at the output of the sensor and the data register is reset to configure the structural test by scanning in a reset pattern or wherein the data register forming part of a scan chain of the structural test is a second data register that receives the measured characteristic of a delay from a first data register at the output of the sensor and the second data register is reset to configure the structural test by an output of the first data register.

In embodiments, there may be considered a method for testing a semiconductor integrated circuit (IC), the method comprising: scanning test patterns into internal circuits of the semiconductor IC, the internal circuits of the semiconductor IC comprising a margin measurement sensor; measuring a margin, using the margin measurement sensor, the margin comprising a characteristic of a comparison between a test signal path of the semiconductor IC and a delayed signal path, the delayed signal path being a signal of the test signal path delayed by a variable delay time; and scanning out an output of the margin measurement sensor.

In embodiments, the test patterns are generated using Automatic Test Pattern Generation (ATPG). The method may further comprise: scanning out the output of the margin measurement sensor using a ATPG shift mode.

In embodiments, the characteristic of a comparison comprises one or more of: a pass or fail condition; a delay threshold comparison result; a delay indication; and a worst case delay indication.

In embodiments, there may be considered a method for testing a semiconductor integrated circuit (IC), the method comprising: scanning a test condition into a margin measurement sensor forming part of internal circuits of the semiconductor IC; and measuring, at the margin measurement sensor during an operational mode of functional circuits of the semiconductor IC, one or more margins, each margin being measured based on a characteristic of a comparison between a test signal path of the semiconductor IC and a delayed signal path, the delayed signal path being a signal of the test signal path delayed by a variable delay time.

In embodiments, the margin measurement sensor receives a plurality of signal paths of the semiconductor IC and combines the received plurality of signal paths of the semiconductor IC to provide the test signal path.

In embodiments, scanning into the internal circuits of the semiconductor IC is controlled by a scan clock having a first frequency and wherein an operation of the semiconductor IC, during which the measuring is performed, is controlled by a capture clock having a second frequency that is higher than the first frequency.

In embodiments, there may be considered a method for testing a semiconductor integrated circuit (IC) using a separate tester device, the method comprising: scanning a test condition from the tester device into a margin measurement sensor forming part of internal circuits of the semiconductor IC; and receiving at the tester device from the margin measurement sensor, one or more margin measurements, each margin being measured based on a characteristic of a comparison between a test signal path of the semiconductor IC and a delayed signal path, the delayed signal path being a signal of the test signal path delayed by a variable delay time.

In embodiments, the method may further comprise: operating in a characterization mode, by determining a minimum margin associated with one or more signal paths coupled to the margin measurement sensor for each of a plurality of structural test patterns at each of an Automatic Test Equipment and an Evaluation Board, comparing the determined minimum margin for each of the Automatic Test Equipment and the Evaluation Board and correlating a performance of Automatic Test Equipment and the Evaluation Board; and/or operating in High Volume Manufacturing (HVM) mode, by setting the variable delay time for the margin measurement sensor to a threshold value and classifying the IC based the measured margin using the threshold value.

In embodiments, there may be considered a computer program product for testing a semiconductor integrated circuit (IC), comprising: a scanning module, for scanning a test condition into a margin measurement sensor forming part of internal circuits of the semiconductor IC; and a measurement module, for controlling the margin measurement sensor to measure one or more margins, each margin measured based on a characteristic of a comparison between a test signal path of the semiconductor IC and a delayed signal path, the delayed signal path being a signal of the test signal path delayed by a variable delay time.

In embodiments, there may be considered a semiconductor integrated circuit (IC), comprising: structural test circuitry, for receiving test patterns and running one or more structural tests on functional circuitry of the semiconductor IC; and a margin measurement sensor, configured to measure a margin, the margin comprising a characteristic of a comparison between a test signal path of the semiconductor IC and a delayed signal path, the delayed signal path being a signal of the test signal path delayed by a variable delay time.

In addition to the exemplary aspects and embodiments described above, further aspects and embodiments will become apparent by reference to the figures and by study of the following detailed description.

BRIEF DESCRIPTION OF THE FIGURES

Exemplary embodiments are illustrated in referenced figures. Dimensions of components and features shown in the figures are generally chosen for convenience and clarity of presentation and are not necessarily shown to scale. The figures are listed below.

DETAILED DESCRIPTION

Figure 1:
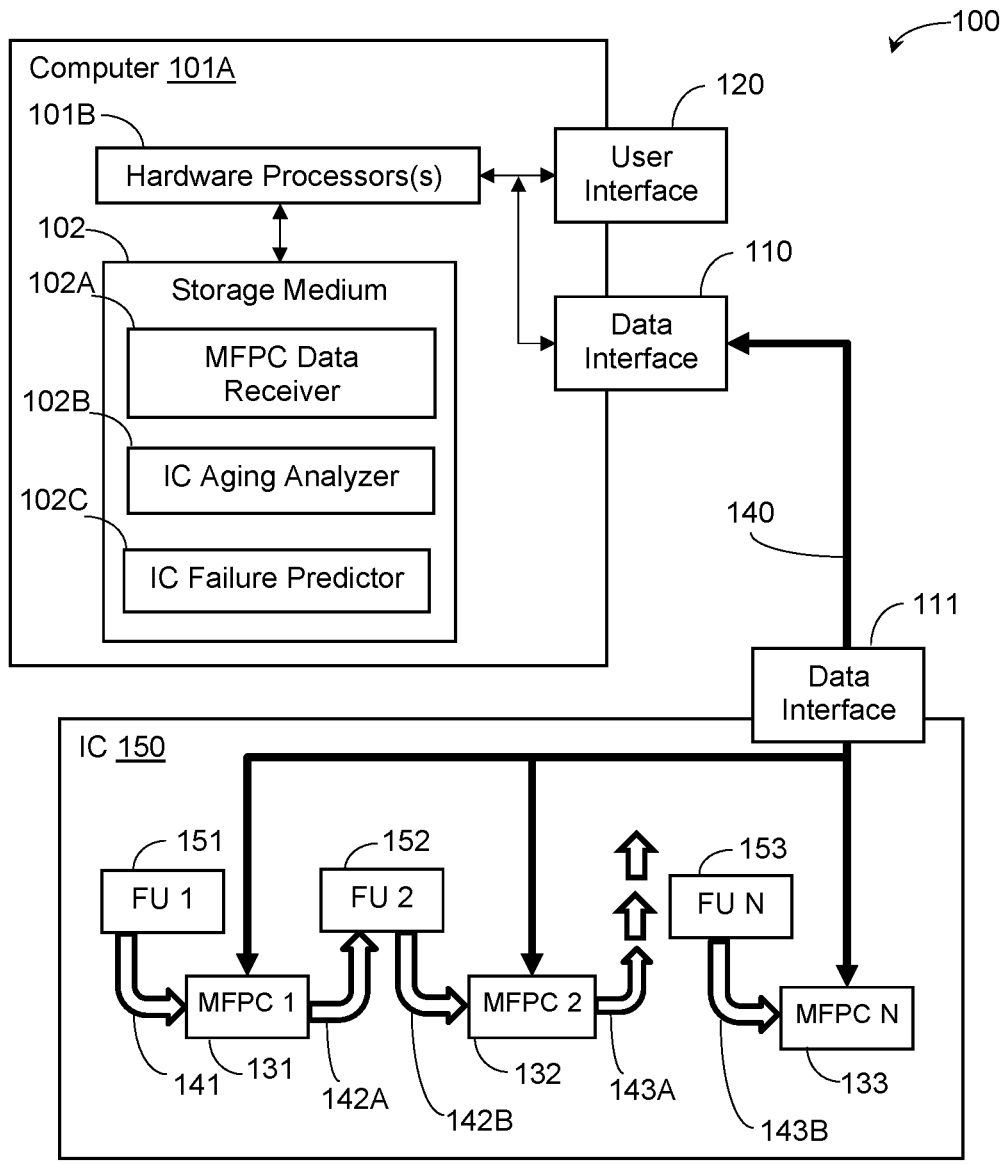
FIG. 1 shows schematically a computerized system for IC margin measurement and failure prediction.

Disclosed herein are methods and devices for determining and predicting a future failure of an individual integrated circuit (IC). Also disclosed is a timing delay margin measurement circuit for an IC, from its first structural testing and/or during its operation, over time (for example, during any time period from or subsequent to its first operation). A dedicated circuit (which may be detector), such as a failure prediction circuit (FPC) or a margin measurement and failure prediction circuit (MFPC), is placed at selected points along one or more data paths in a digital IC (such as one or more FPC or MFPC per data path), where each dedicated circuit combines multiple individual data paths into a fewer number of test paths. By splitting each test signal into two, and applying a delay circuit to one of the split signal paths, a fingerprint or signature of the delays of each path of the data path may be acquired during each clock cycle of the functional unit.

As used herein, the term "margin" refers to the difference between (a) a timing delay exhibited by a certain data path, and (b) such timing delay that will cause failure because it prevents a data signal transmitted over the data path from finishing its propagation within a single clock cycle. For example, for a 0.5 nanoseconds-long clock cycle of a 2 GHz IC, and a timing delay of 0.45 nanoseconds exhibited by a certain data path, the margin is 0.05 nanoseconds; if the timing delay of that data path will increase (e.g., due to aging) by more than 0.05 additional nanoseconds, any data signal transmitted over that data path will not manage to propagate within a single clock cycle, leading to failure.

Therefore, according to present embodiments, the margin may be measured by artificially introducing additional delay to the measured data path, and incrementally increasing that delay in subsequent clock cycles. For example, the initial artificial delay may be 0.01 nanoseconds, which is then increased in increments of 0.01 nanoseconds with every clock cycle. The fourth incremental increase will bring the artificial delay to 0.05 nanoseconds, and, assuming that the (yet unknown) margin is indeed 0.05 nanoseconds, the data signal will not successfully propagate and the FPC or MFPC will determine the value of 0.05 nanoseconds to be the margin. Notably, the artificially-introduced delay that caused the propagation failure is exactly the margin.

As used herein, the term "fingerprint" and/or "signature" mean the profile of signal strengths, such as a vector, series, and/or the like, resulting from a measurement of timing delay margins of a combination of signals of a data path.

For each clock cycle of the functional unit the output data path may have a different data value. Thus, during each clock cycle, a different combination of the logical paths within the functional unit may be tested, producing a different fingerprint. By collecting a large number of fingerprints over time, a dataset of fingerprints may be analyzed. The analysis of the fingerprint datasets may determine the performance and/or predict future failure of the individual IC.

In general terms, there may be considered a semiconductor integrated circuit (IC) comprising: a signal path combiner, comprising a plurality of input paths (for example to receive signals on a data source or data path, from a memory circuit and/or from logic circuits grouped by a clock enable) and an output, the output being based on a combination of respective signals received on each of the input paths; a delay circuit having an input electrically connected to the signal path combiner output, the delay circuit delaying an input signal by a variable delay time to output a delayed signal; and a comparison circuit arranged to provide a comparison output based on a comparison of the signal path combiner output and the delayed signal, wherein the comparison output is provided in a comparison data signal to at least one mitigation circuit. The combination of the signal path combiner, delay circuit and comparison circuit may provide an FPC or MFPC.

A method for using such an IC may also be considered (in which using may comprise one of more of operating, analyzing and configuring, for instance). For instance, this may include a method for using a semiconductor integrated circuit (IC). The method may comprise: combining respective signals received on each of a plurality of input paths at a signal path combiner to provide an output; delaying the signal path combiner output by a variable delay time at a delay circuit to output a delayed signal; and comparing the signal path combiner output and the delayed signal to provide a comparison output and providing the comparison output in a comparison data signal to at least one mitigation circuit.

It may also be considered that the steps of combining, delaying and comparing may be repeated for each of a plurality of delay times. In this way, a plurality of comparison outputs may be provided. An identifying characteristic (i.e. a signature or fingerprint) for the IC may thereby be determined based on the plurality of comparison outputs. By repeating this process over different clock cycles, multiple such fingerprints may be determined. The fingerprints may then be tracked at different times, for example by tracking changes in the fingerprint over time (using intervals at least as long as the length of time taken to determine a single fingerprint and optionally longer).

Further optional method features corresponding with the steps implemented by any of the features described with reference to the IC may also be provided. Examples of these may be discussed below. Specific embodiments will also be discussed below, but further reference will also be made to generalized senses or terms of the disclosure.

Note that a data path is one example of a design style that can be handled by the FPC or MFPC, other examples may be memory circuits (the FPC/MFPC is located at the output of the memory) and other logic circuits that are grouped together with respect to a certain clock enable.

Optionally, aspects of embodiments described herein may be applied to any reliability problem of IC performance, such as aging, latent defects that manifest in the design and cause degradation, manufacturing differences within/between ICs, manufacturing differences between fabs, and/or the like. The techniques described may find changes in timing delays from any source or cause, predict a future failure before the IC failure causes a device/system failure, and enable corrective and preventive action before the specific IC failure. While reliability issues, such as aging, electro-migration, and/or the like, are used here as examples, the techniques may also be applied to latent defects, such as random defects, systematic defects, unknown defects, and/or the like.

Optionally, the delay me be changed in small increments (steps), producing one or more "sweeps" of time delays, and collecting associated fingerprints at each different time delay. The sweep may be analyzed to determine the operation of the individual IC, predict a future failure of the IC, and/or the like.

Optionally, one or more datasets (e.g. from signals on the IC) may be analyzed combinatorically to determine the operational delays of each path of the data path (or equivalent signal path), each logical processing path of the functional unit, and/or the like.

Optionally, one or more datasets may be analyzed statistically to predict a future failure the IC. For example, an IC degradation trend may be analyzed in one or more delay margins measured using the failure prediction circuit, such as be analyzing a minimum delay margin change over time.

Optionally, one or more datasets may be analyzed using machine learning (ML) to monitor the failure of the IC, predict a future failure of the IC, and/or the like.

Optionally, one or more datasets may be analyzed to design a future IC.

Optionally, one or more sweeps may be analyzed combinatorically to determine the operational delays of each path of the data path, each logical processing path of the functional unit, and/or the like.

Optionally, one or more sweeps may be analyzed statistically to predict a future failure the IC. For example, a regression analysis of one or more sweeps determines changes in timing delays, and an extrapolation to a timing delay failure value determines the time to failure.

Optionally, one or more sweeps may be analyzed using machine learning to monitor the failure of the IC, predict a future failure of the IC, and/or the like.

Optionally, one or more delay time sweeps may be analyzed to design a future IC, where the future IC is designed to avoid the failures of the previous ICs.

Optionally, one or more sweeps are analyzed using machine learning at the beginning-of-life of the chip, e.g. the timing delay margins signature or fingerprint of the IC at the beginning-of-life. The signature or fingerprint may be used for chip outlier detection/screening, i.e. a specific IC is given a unique identity and the signature as compared to other ICs that allows detecting anomaly's in a large manufacturing scale.

Figure 2:
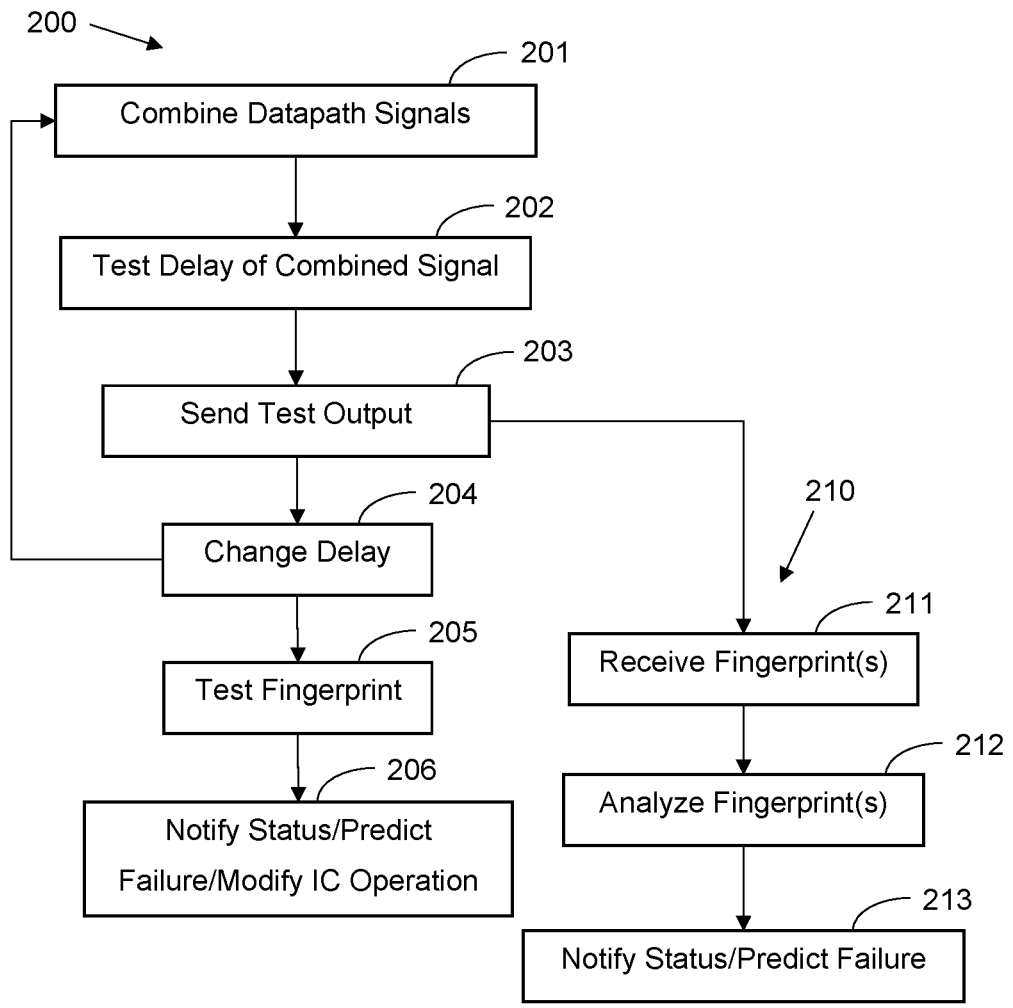
FIG. 2 shows flowcharts of methods for IC margin measurement and failure prediction.

Reference is now made to FIG. 1 and FIG. 2, which show schematically a computerized system 100 and flowcharts (200 and 210) of methods, respectively, for IC failure prediction and margin measurement of logic-paths at the IC testing (tester or system level). System 100 comprises an IC 150, a computer 101A, and a data interface connection 140 connecting the two. IC 150 comprises multiple function units (as at 151, 152, 153, and the like), and data paths (as at 141, 142A, 142B, 143A, 143B, and the like, which may include synthesized logic) between them. IC 150 comprises margin measurement and failure prediction circuits (MFPCs; as at 131, 132, 133, and the like) for capturing signals from data paths (as at 142A, 143A, and the like), and determining delay timings of at least some signals form the respective data path. MFPCs 131, 132, or 133 combine 201 signals from the data path, and test 202 one or more delays of the combined signals. IC 150 comprises a data interface for connecting to data interface connection 140, and sending 202 the delay timings to computer 101A. Delay timing data collected for multiple signals of the data paths and/or for multiple delay values, such as be changing 204 the delay, may be considered the fingerprint of the delay timings.

Computer 101A comprises one or more hardware processors 101B, a user interface 120 and a non-transitory, computer readable storage medium 102. Storage medium comprises program code, such as an MFPC Data Receiver 102A, an IC Aging Analyzer 102B, an IC Failure Predictor 102C, and/or the like, the program code comprising instructions that when executed on hardware processor(s) 101B, cause hardware processor(s) 101B to receive 211 the signal delay data (i.e. fingerprints) using a data interface 110, such as using MFPC Data Receiver 102A. IC Aging Analyzer 102B analyzes 212 the fingerprints, and IC Failure Predictor 102C notifies 213 an operator of a status, a failure prediction, a preventative action, and or the like, such as using user interface 120.

Optionally, the delay timings are analyzed by a circuit (not shown) of IC 150 to determine when clock and/or logic modifications 206 on IC 150 improve the lifetime of IC 150 before failure. Optionally, the delay timings are analyzed by a circuit (not shown) of IC 150 and a notification 206 is issued of the status or failure prediction.

Optionally, the delay timing fingerprint may be generated at the IC testing (tester or system) to extract the time-zero margin map of the data paths in a certain unit.

The fingerprint may be analyzed at a time of initial operation and monitored over the life of the IC to determine when a predicted failure may occur. For example, a defect degradation gradient analysis may determine the future time of a failure of the IC. For example, analyzing the minimum margin of a fingerprint, plotting the minimum margin over time, and extrapolating the plot to a margin delay of zero determines the predicted time of failure.

Figure 3A:
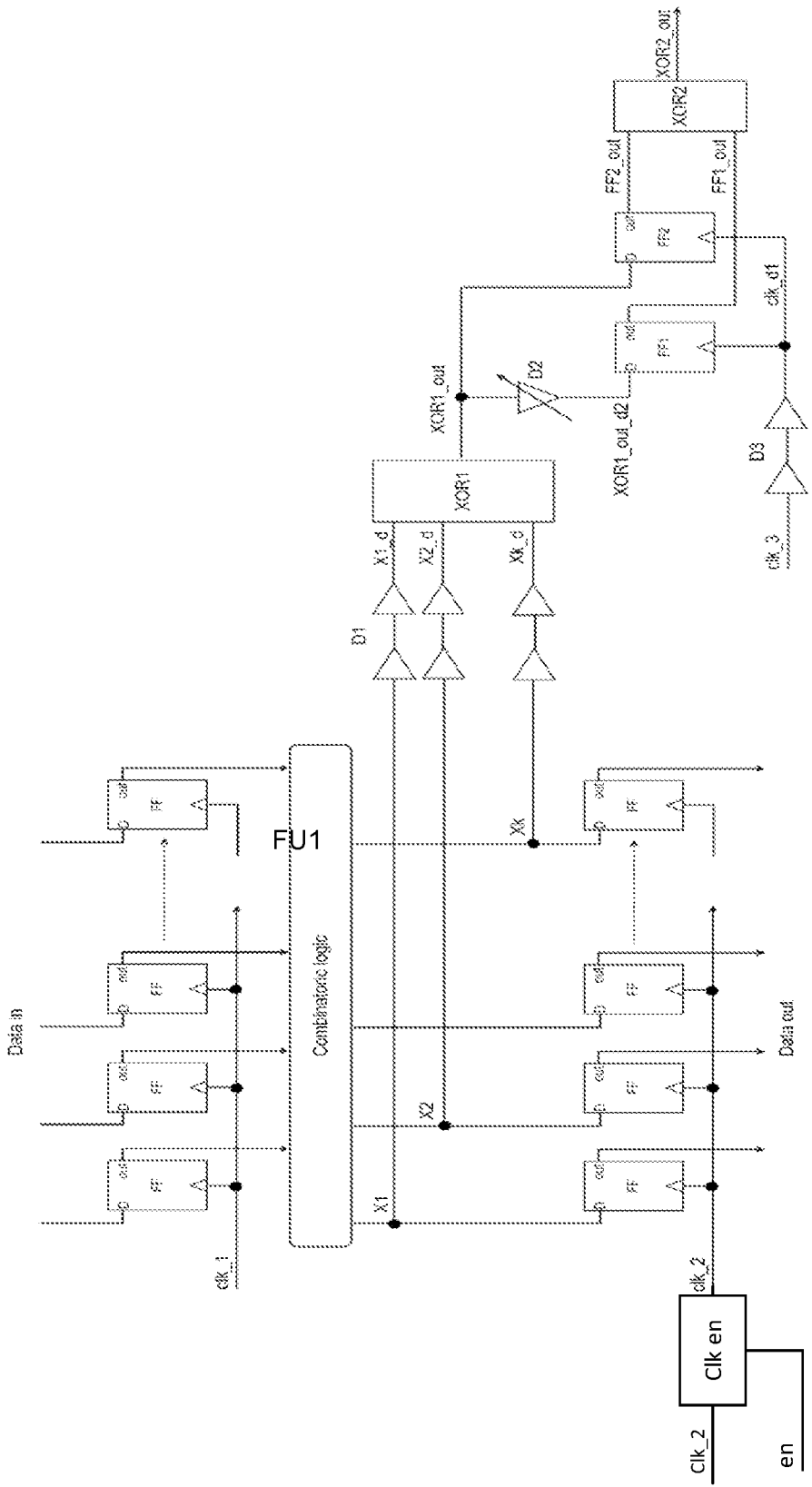
FIGS. 3A-3C show respective XOR-based circuit diagrams for IC margin measurement and failure prediction.

Reference is now made to FIG. 3A, which shows a XOR-based circuit diagram for IC failure prediction. An XOR component (XOR1) combines the signals from multiple data paths, such as 64, 128, 256, 512, or the like number of signals, into a single signal XOR1_out. XOR1_out is fed into a first flip-flop FF2, and a delay line D2. The delayed XOR1_out is fed into a second flip-flop FF1. FF1 and FF2 are activated by a clock clk_3, and their outputs XOR combined with XOR2. XOR2_out is a logical 1 for each delay where one of XOR1_out and XOR1_out_d2 is logical 1 at time of clk_d1.

Thus, multiple instances of clk_d1 may and/or multiple values of D1 may determine timing delay data of the delay along data paths of combinatorial (Combinatoric) logic FU1, and thus the fingerprint of timing delays. By analyzing these timing delays over time, the MFPC may detect which of the paths of FU1 is degrading and/or aging fastest, and may cause failure of IC 150.

The output signal of XOR1 may be considered a compression of the input signals that preserves the minimum timing margin delays of the input signals of the data path. The output of XOR2 may be logic-1 when the minimum margin of an input signal is smaller than the delay associated with D2. Thus, XOR1 may be a parity checker, i.e. the output is logical 1 when the parity of the input signals is logical 1. Each rising-edge of the compressed signal (XOR1 output) may be associated with a rising edge of one of the input signals. For the simple case in which the minimal timing delay margin is associated with only one input, the last rising or falling transitions of XOR1-output represents the minimal margin. This concept may be proven by a mathematical proof, described hereinbelow, as well as by event-based simulations. For example, special cases may be proved by simulation, where the margin of several signals is smaller than D2, multiple signals switched simultaneously, and/or the like.

In the general terms considered above, the IC may further comprise: a first internal storage circuit, electrically connected to the signal path combiner output and arranged to provide the stored signal path combiner output as a first input to the comparison circuit; and a second internal storage circuit, electrically connected to the delayed signal and arranged to provide the delayed signal as a second input to the comparison circuit. However, such a configuration is optional, as will now be discussed.

Figure 3B:
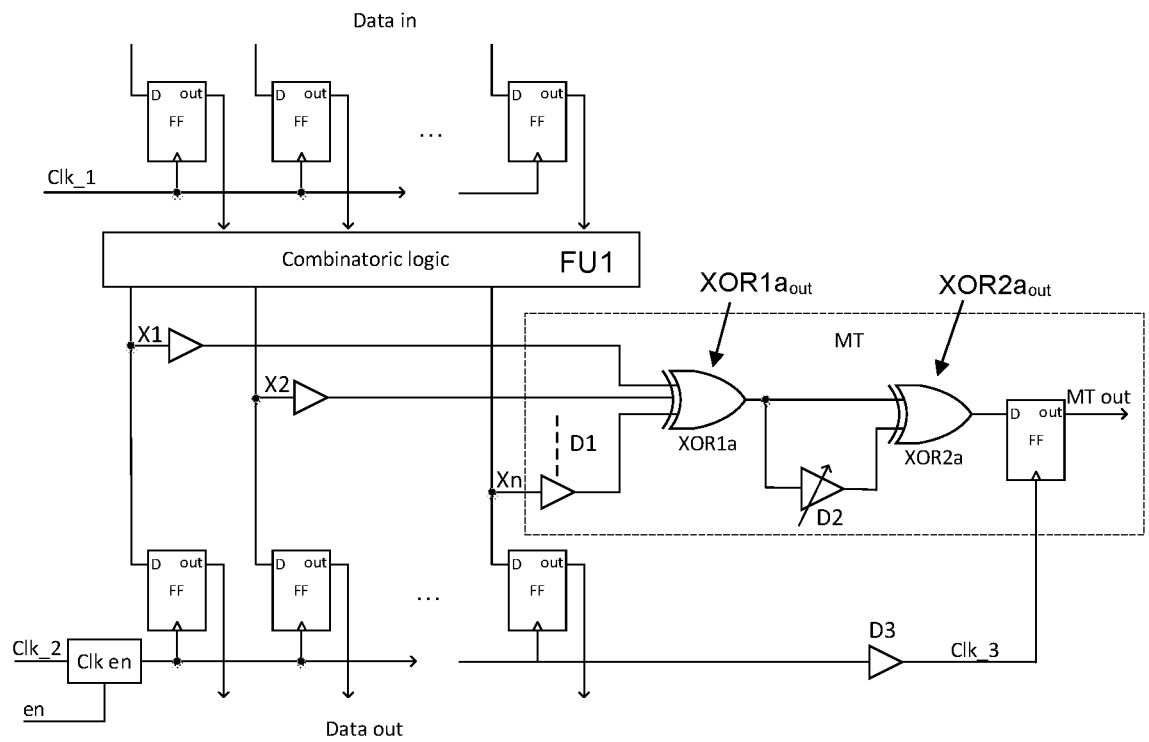

Reference is now made to FIG. 3B, which shows a different version of a XOR-based circuit diagram for IC failure prediction, in comparison with that shown in FIG. 3A. The data path shown in FIG. 3B has essentially the same structure as that shown in FIG. 3A. In this version, a XOR component XOR1$a$ combines the signals from the data path, such as 64, 128, 256, 512, or the like number of signals, into a single output signal, XOR1$a_{out}$. XOR1$a_{out}$ is fed as a first a first input to a second XOR circuit XOR2$a$ and in parallel, to a delay-line D2, the output of which provides a second input to the second XOR circuit XOR2$a$. The delayed output signal from the second XOR circuit XOR2$a$, XOR2$a_{out}$, is fed into a flip-flop FF1$b$. Flip-flop FF1$b$ is activated by a clock (clk1$a$). The second output signal XOR2$a_{out}$ is a logical 1 for each delay where the two inputs of the second XOR circuit XOR2$a$ are at different logic state at time of clk1$a$.

Figure 3C:
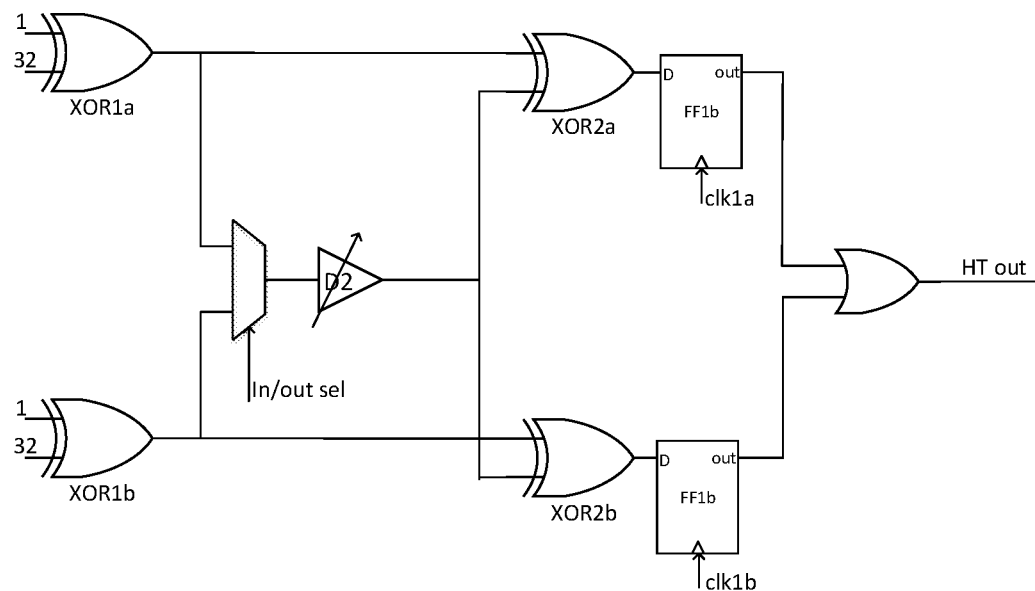

Reference now is made to FIG. 3C, which shows a further different version of a XOR-based circuit diagram for IC failure prediction, in comparison with that shown in FIG. 3A. In this version, two XOR-based failure prediction circuits are provided that use one delay-line circuit. In other words, two data paths are provided, each of which may be in accordance with that shown in FIG. 3A or FIG. 3B.

The first failure prediction circuit comprises: a first XOR component XOR1$a$ that is driven by a set of parallel-input signals from a first data path (as discussed with reference to FIG. 3A or FIG. 3B above); a second XOR component XOR2$a$; and a first flip-flop FF1$b$ that is clocked by a first clock signal clk1$a$.

The second failure prediction circuit comprises: a third XOR component XOR1$b$ that is driven by a set of parallel-input signals from a second data path (as discussed with reference to FIG. 3A or FIG. 3B above); a fourth XOR component XOR2$b$; and a second flip-flop FF1b that is clocked by a second clock signal clk1$b$.

A common delay-line D2 serves the two failure prediction circuits with a multiplexer mux selecting, in a time-sharing mode, whether the output of the first XOR component XOR1$a$ or the output of the third XOR component XOR1$b$ is provided as an input to the common delay-line D2. This is controlled using a selection signal (In/out sel). The configuration of each of the two failure prediction circuits is otherwise as shown in FIG. 3B. The output of the first flip-flop FF1$b$ clocked by first clock signal clk1$a$ and the output of the second flip-flop FF1$b$ clocked by second clock signal clk1$b$ are provided as inputs to an OR gate to generate an output signal MT-out. When the multiplexer mux connects the output of the first XOR component XOR1$a$ to the input of the delay-line D2, output signal MT-out is a logical 1 for each delay where the two inputs of the second XOR component XOR2$a$ are at different logic state at time of the first clock signal clk1$a$. When the multiplexer mux connects the output of the third XOR component XOR1$b$ to the input of the delay-line D2, output signal MT-out is a logical 1 for each delay where the two inputs of the fourth XOR component XOR2$b$ are at different logic state at time of second clock signal clk1$b$.

In general terms, it may be further considered that the signal path combiner is a first signal path combiner arranged to receive a plurality of signals from a first data source (which may be a data path or other set of signals as discussed herein) and the comparison circuit is a first comparison circuit.

Then, the IC may be considered to further comprise a second signal path combiner, comprising a plurality of input paths and an output, the second signal path combiner output being based on a combination of respective signals received on each of the input paths, the signals being received from a second data source. Then, a multiplexer may be provided, configured to receive the first signal path combiner output, the second signal path combiner output and to selectively output the first signal path combiner output or the second signal path combiner output based on a received selection signal. The output of the multiplexer may be provided as the input to the delay circuit (such that the delay circuit is common to both the first and second signal path combiners.

The IC may further comprise a second comparison circuit arranged to provide a second comparison output based on a comparison of the second signal path combiner output and the delayed signal (which may thereby be common to both the first and second comparison circuits). An OR gate may further be arranged to receive as inputs the first comparison output and the second comparison output and to provide an output as the comparison data signal to the at least one mitigation circuit.

With reference to the method aspect, this may further comprise: combining respective signals received on each of a plurality of input paths at a second signal path combiner to provide an output, the signals being received from a second data source; receiving the first signal path combiner output, the second signal path combiner output and a selection signal at a multiplexer and selectively outputting the first signal path combiner output or the second signal path combiner output based on the selection signal, the output of the multiplexer being provided as the input to the delay circuit such that the step of delaying comprises delaying the first signal path combiner output or the second signal path combiner output by the variable delay time at the delay circuit to output the delayed signal; comparing the second signal path combiner output and the delayed signal to provide a second comparison output; and receiving at an OR gate, the first comparison output and the second comparison output as inputs and outputting the comparison data signal as an output from the OR gate to the at least one mitigation circuit.

Optionally, a first comparison storage circuit, controlled by a first clock signal, may be arranged to receive the first comparison output. Then, a second comparison storage circuit, controlled by a second clock signal (which may be the same or different from the first clock signal) may be arranged to receive the second comparison output. The first comparison storage circuit is advantageously arranged to provide the first comparison output as a first input to the OR gate and the second comparison storage circuit is arranged to provide the second comparison output as a second input to the OR gate.

Figure 4:
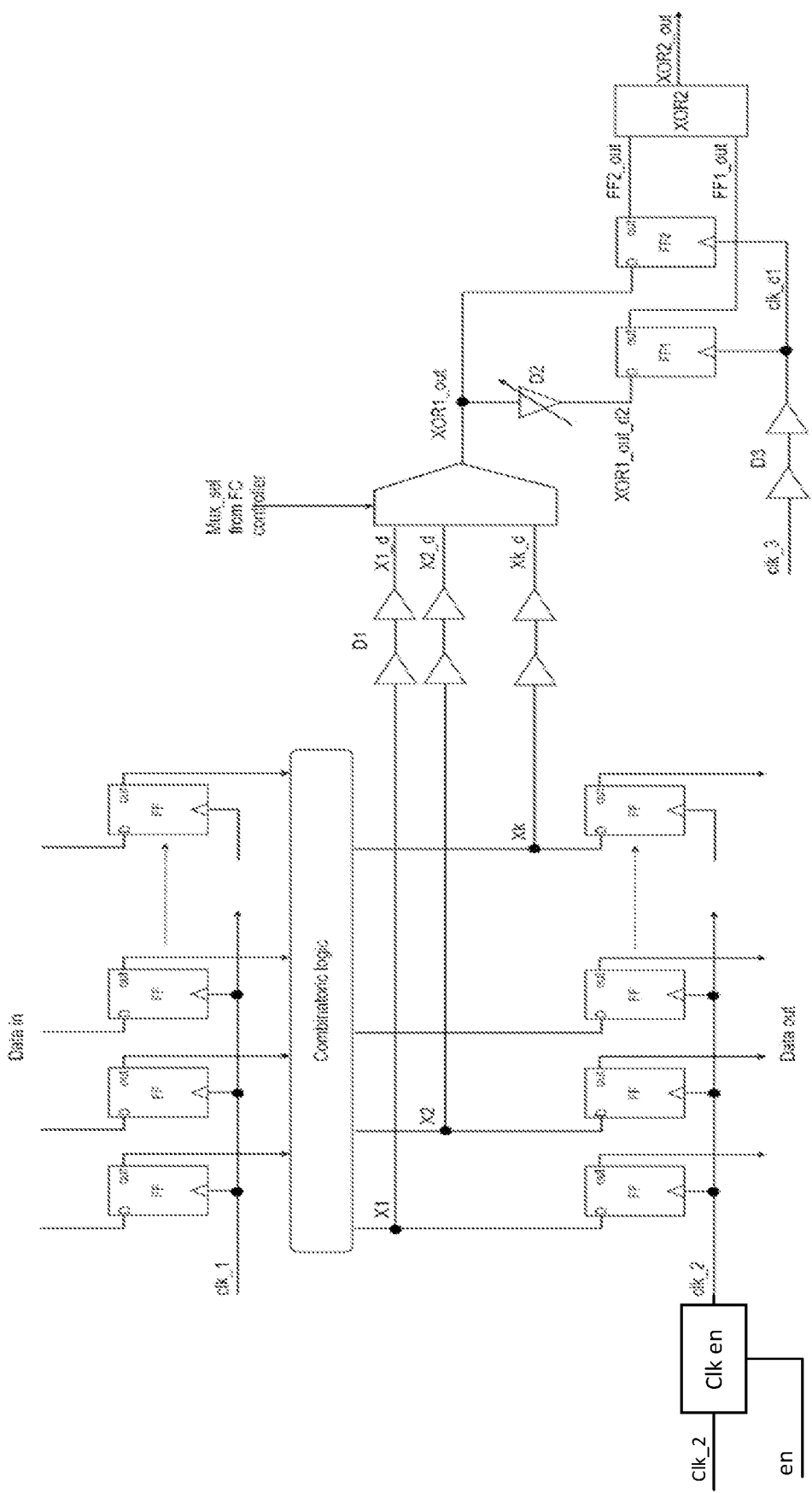
FIG. 4 shows a MUX-based circuit diagram for IC margin measurement and failure prediction.

Reference is now made to FIG. 4, which shows a MUX-based circuit diagram for IC failure prediction. A multiplexer (Mux sel) is used to select one or more of the data paths, and then detect a delay timing fingerprint as described herein. The advantage with the MUX-based MFPC is that the one signal is selected for delay timing at a time, so failure may be detected with less data (such as with a dedicated analysis circuit on the IC). Optionally, a hybrid MUX/XOR based MFPC may be used that combine some of the advantages from each type of MFPC.

Figure 5:
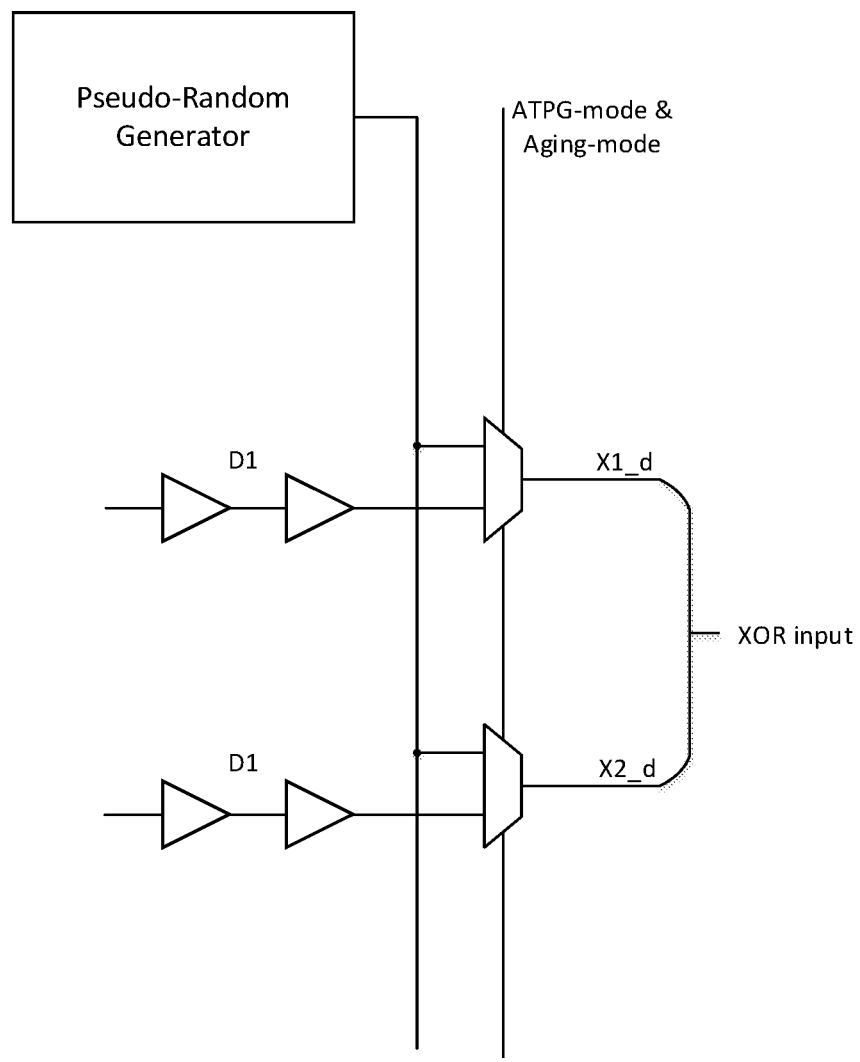
FIG. 5 shows a circuit diagram for anti-IC aging mode.

Reference is now made to FIG. 5, which shows a circuit diagram for anti-IC aging mode. The figure shows an anti-aging technique that deactivates the XOR circuit when the MFPC circuit is not enabled i.e. the MFPC clock is gated. When the circuit is disabled, a constant logic delay will increase the circuit degradation, such as due to NBTI effects. To mitigate the NBTI degradation the XOR circuit is toggled whenever the MFPC clock is gated. Alternatively, each of the signals is monitored separately for margin degradation. FIG. 5 is just one example of alternative embodiments of circuit corrections that may be performed to compensate for the degradation and/or aging of the IC circuit. Many other example circuits may be used.

The techniques disclosed herein may be expand to other types of logic paths/signals, path lengths, and different types of generating and sampling electronic elements. For example, phase paths, latch-based logic paths, gated-clock logic paths, flip-flop (FF) fall timing logic signals, and/or the like. For example, embodiments may detect hold-failure (min-delay) that is caused by a delay degradation in the clock path. In this example, a new delay-path (such as D4) is located between the clock of FF1 and FF2 such that the D4 delay value delays the clock of FF2.

The MFPC may be always on or activated by an enable signal. For example, an enable signal represents a logical OR of the enable signals corresponding to the group of FFs that are sampled by the MFPC. When the enable is low, the MFPC may enter into an anti-IC aging mode detection, where a dedicated clock is used to toggle the MFPC to mitigate NBTI aging effects.

When the MFPC covers large logic areas (FUs) of the IC, the MFPC may be used as a timing delay margin signature or fingerprint of the IC at first operation. Over time, the MFPC may measure the margin signature at different times to analyze and detect the time gradient of the IC degradation/aging. Different gradient functions may be related to different types of defects and degradation modes.

Optionally, the signature comprises multiple, overlapping delay margins, and a several critical timing delay margins are identified as having different time gradients each, and each is separately analyzed to predict a future IC failure. For example, non-linear, spatiotemporal correlation methods are used to track multiple timing delay margins simultaneously from a series of signatures or fingerprints, each signature or fingerprint representing a one-dimensional vector of all timing delays overlapped. For example, a transformation is performed of multiple one-dimensional vectors to produce a two or more-dimensional data representation. For example, Laube et al., "Analyzing Relative Motion within Groups of Trackable Moving Point Objects", in Lecture Notes in Computer Science (GIScience 2002), vol. 2478 (Springer, Berlin, Heidelberg), pages 132-144, which is incorporated herein by reference in its entirety.

When the performance of semiconductor integrated circuits is degraded over time, the progression of physical defects may gradually increase the delay time of the IC's circuits. The IC may fail when the delay time exceeds the IC's clock cycle time. Existing defect detection techniques may be able to detect defects after failure occurs, but when eminent failure is predicted, preemptive maintenance may be performed. This is especially important to applications where cost of failure is high (such as autonomous vehicles), cost of replacement is high (such as satellite IC failure), cost of failure to product image is high (such as a resulting negative user experience is created by failure), and/or the like. An integrated circuit (IC) embodiment using the techniques disclosed herein, includes a failure prediction circuit and a system that may alert of an imminent failure before the failure occurs.

For example, in the generalized sense discussed above, the variable delay time may be set in an integer multiple of increments equal to a clock period of the IC divided by a factor (a "signature vector size"), which is optionally from 1 to 100,000.

In some embodiments, the failure prediction circuit is comprised of a pair of storage components (e.g., flip-flops) that both receive a data signal output from a large number of paths of the IC, such as a data path, memory paths, logic paths, and/or the like. To reduce overhead, the data signal is reduced using Hamming codes, parity codes, other error-correction techniques, and/or the like, before being stored in the two storage components. The two storage components differ from each other in data signal input timings, clock signal input timings, phase of input signals, input logic thresholds of the data signal, and/or the like. For example, a variable timing circuit is used to delay the signal to one of the flip-flops.

The FPC or MFPC further includes electronic components that determine (a) coincidence or non-coincidence of the outputs from the two storage components, and (b) how close the delay between non-coinciding outputs is to the clock cycle time of the IC.

In operation, after the coincidence or non-coincidence of the signal outputs is determined (such as using an XOR component), the failure prediction circuit increments the input timing, clock signal input timing, or input logic thresholds of one of the storage components, and the coincidence or non-coincidence of the outputs is determined again. This cycle may be repeated with small increments.

A log is maintained of the relative length of the sensed delay in comparison to the clock cycle time, as well as of the storage components increment used. Analysis, such as trend detection, combinatorial analysis, machine learning, regression analysis, anomaly detection, and/or the like, may be performed on the logged data, to estimate when the ICs degradation may reach a time when the IC fails, such as when the shortest logical path delay exceeds the subsequent clock cycle time.

This measurement and/or estimation may be utilized in a number of ways. An alert may be issued to the user of the system where the IC is implemented, indicating either the margin (how close the delay is to the IC's clock cycle time) or the estimated failure time. Further, the agent may instruct an operational change of the IC, such as clock speed or voltage reduction, which may postpone the failure and prolong the IC's lifespan.

By continuously monitoring logic circuits at the data path output using a small number of components, resources, such as IC area, power, and/or the like, may be conserved relative to existing techniques.

For example, the input signals are compressed to generate a Hamming code (compressed into the Hamming space). The Hamming-code may be used for higher-order of error detection, correction, and/or prediction process. For example, an XOR-based circuit is used to combine all data path signals into two unified signal path that implements a modulo-4 logic operation. Other types of compression (source) code may be used additionally or as an alternative.

In the general terms discussed previously, it may be understood that the signal path combiner (or at least one of the signal path combiners) comprises at least one of a logical XOR combiner (as shown in FIG. 3A or FIG. 3B), a Hamming parity combiner, and a multiplexer.

The technique may be expanded to other types of logic-paths and sampling sequential elements, for example:
Phase paths.
Latch-based logic paths.
Gated-clock logic paths.
Data path signal fall-based logic paths.
Memory inputs and outputs.

The failure prediction circuit may be always on or may be activated by an enable signal that represents a logic-OR of the signals of a data path. When the enable signal is low, the failure prediction circuit uses a dedicated clock to toggle the circuit to mitigate aging effects.

Integrated circuits may implement a large number of synchronous and timing sensitive logic circuits. When the delay of the circuit is increased due to physical degradation, then a timing violation occurs, and the violation may affect the functionality of the circuit. The physical degradation may be caused by aging effects, or due to defects that developed during use. The failure prediction circuit tracks the logic delay margin over time, and may predict a failure due to physical delay degradation.

In the general terms discussed above, it may therefore be considered that the mitigation circuit is at least one circuit from the group consisting of: a notification circuit (for example, as configured to produce notification 206 or 213); a timing delay measurement (or estimation) circuit (for example, for providing a timing delay output); a data transmission circuit; an IC anti-aging compensation circuit (for instance, as discussed with reference to FIG. 5 above); and a failure analysis circuit.

Where the mitigation circuit is a data transmission circuit, it may be electrically connected to a computerized server. Then, the computerized server is advantageously configured to receive multiple instances of the comparison data signal (for example in respect of different times and/or different data sources). The computerized server may thereby perform a failure prediction analysis of the comparison data signals. Optionally, it may send a notification to a mitigation module (such as an IC anti-aging compensation circuit) when the failure prediction analysis predicts failure of the IC within a predefined time.

At least some of the comparison data signals may be generated at multiple values of the variable delay time and/or at least some of the comparison data signals may be generated from multiple instances of at least one value from multiple values of the variable delay time. Optionally, the failure prediction analysis comprises at least one of a machine learning analysis, a trend analysis, a multiple object tracking analysis, and a multivariant analysis. Advantageously, the failure prediction analysis comprises receiving comparison data signals and/or failure prediction analysis results from multiple different ICs.

The failure prediction circuit beneficially continuously monitors a large number of logic circuits, such as signals of a data path on the output of a functional unit of an IC, using small IC area and power.

In some embodiments, a computer algorithm may be used to determine the population of the failure prediction circuits within a unit per a pre-defined coverage. It may use design-data such as memory-circuits and flip-flop-circuits within the unit. The computer algorithm may also be used to automatically locate the FPC or MFPC circuits per the unit clock-gate signals and to automatically set the input-signal-size per FPC or MFPC for optimal performance (maximum instance coverage with minimum number of FPC or MFPC circuits).

In some embodiments, the delays within the failure prediction circuit may be calibrated. This may be done in order to have a very fast correlation path to the design data and to provide accurate margin results at time zero (during test). One calibration methodology may use pre-silicon (Pre-Si) estimator functions that are based on on-die sensors (agents) in post-silicon (Post-Si) to translate the FPC or MFPC circuit measured margin in Pre-Si to the worst case margin of the monitored endpoints (FFs) margins.

In general terms, this may be considered to include measuring or estimating a timing delay for the IC (particularly at initial or time-zero operation), based on the comparison data signal provided to the mitigation circuit. The timing delay may be based on a plurality of comparison outputs (which may be in a single comparison data signal or a plurality of comparison data signals), for example determined by repeating the steps of combining, delaying and comparing for each of a plurality of delay times.

In some embodiments the delay through $X1 \ldots Xn+Xor1A+Xor2A$ is balanced to a delay applied to the clock used for the output flip-flop (D3) in order to make the calibration shift minimal.

In some embodiments, the timing margin data of a large-scale logic circuit within a unit or a die that was extracted at time-zero, such as digital logic circuits and/or the like, may be tracked and compared over time. The tracking may detect and/or predict a timing failure due to change in the delay and/or aging degradation of the IC. Referring now to FIG.

11, there is shown shows a Margin-Map diagram of a unit. This is an example of a unit margin map that represents the unit margin finger-print at the beginning of life (the margin is represented by an equivalent buffer-delay). The signature may be used for chip outlier detection/screening. In other words, a specific IC is given a unique identity and the signature is compared to other ICs, which allows detecting anomalies in a large manufacturing scale. The margin-map can be tracked over time to measure the margin signature at different times to analyze and detect the time gradient of the IC degradation or aging. Different gradient functions may be related to different types of defects and degradation modes.

In some embodiments, the margin data of a die can be collected and used for die-classification and anomaly-detection processes. This is done by collecting the margin data of a unit within a die and use ML algorithms to build an estimator function that are based on on-die sensors. More details are described in PCT Publication No. WO 2019/202595, entitled "Integrated Circuit Profiling and Anomaly Detection", dated Oct. 24, 2019, the contents of which incorporated herein by reference in their entirety.

In some embodiments, the margin data can be analyzed per a specific running application to generate an application-based frequency/power binning.

Following are mathematical proofs that may rely on an assumption that all paths are independent. For simplicity, the proof is performed using the circuit described in FIG. 3A. The proof is also valid for the circuit describe in FIG. 3B under the assumption that XOR2$a$ is symmetrical. This assumption may be relaxed in cases of at least some dependent paths when needed, with appropriate amendments. At any time, denoted t, we denote the margin of path $x_i^t$ (path i at time t) by $m_i^t$. In the following, the clock cycle is denoted by T.

Theorem 1: At time t,

A.

For $D2 < \min_{1 \le i \le k} m_i^t = m_{min}^t$, the output of XOR2 is constantly 0'
B. For $D2 > m_{min}^t$, the output of XOR2 may be 1' with some probability P.

Theorem 2: For the second case of theorem 1 ($D2 > m_{min}^t$) the probability P is larger than $$\max_{j \in K^*} 2q_j(1-q_j),$$

where $K^* = \{j > 0 | D2 > m_j^t\}$.

Corollary: Given that by some degradation $m_{min}^{t1} < m_{min}^{t2}$, where $t_2 > t_1$. Then, for D2 such that $m_{min}^{t1} < D2 < m_{min}^{t2}$, the output of XOR2 is 0' on time $t_1$ and 1' with some probability on $t_2$.

Proof of Theorem 1:
Case A: As all the inputs of XOR1 do not change at the time window $(T-m_{min}^t, T]$ it follows that FF1 and FF2 contain the same value, so the output of XOR2 is 0'.
Case B: We represent XOR1 by 3 XORs: XORa, XORb and XORc. Their inputs are as follows:
XORa: a constant 0', plus all the paths i for which $m_i^t < D2$.
XORb: a constant 0', plus all the paths i for which $m_i^t > D2$.
XORc: the outputs of XORa and XORb.

Then, at the time window $[T-D_2, T]$,
The output of XORa may be changed with some probability, as the inputs may be changed during that time.
The output of XORb is constant.
Therefore, the output of XORc, (which is actually the output of XOR1) may be changed at the time window (T−D2,T] with some probability, and hence the output of XOR2 may be 1'.

Proof of Theorem 2:
Let us use the same representation of XOR1 as in the proof of Theorem 1. Then, the probability P in which the output of XOR2 is 1' is the probability in which the output of XORa is changed in two sequential cycles. That probability is $2q_{out}(1-q_{out})$ where $q_{out}$ is the probability that the output of XORa is 0'.

Now, let us represent XORa by 2 XORs: XORa1 and XORa2. Their inputs are as follows:
XORa1: The signal x for which $q_x(1-q_x)$ is the maximal among all the inputs of XORa and the output of XORa2. Note that the output of XORa1 is actually the output of XORa.
XORa2: all the inputs of XORa except of the signal x (for which $q_x(1-q_x)$ is the maximal).

Then, by Lemma 1 it follows that $q_{a1}(1-q_{a1})$, (where $q_{a1}$ is the probability that the output of XORa1 is 0') is larger than $q_x(1-q_x)$. Hence as the output of XORa1 is actually the output of XORa, Theorem 2 is obtained.

Lemma 1: Let a and b stand for signals for which the probabilities for 0' are $q_a$ and $q_b$ respectively. Then, $q_c(1-q_c) \ge \max q_a(1-q_a), q_b(1-q_b)$, where $q_c$ stands for the probability that the output of XOR (a, b) is 0'.

Proof of Lemma 1:
Let us assume, without loss of generality, that $q_a(1-q_a) = \max q_a(1-q_a), q_b(1-q_b)$. Then, by simple algebra it follows that $q_a(1-q_a) = \frac{1}{4}(1-\Delta_a^2)$, where $\Delta_a = 1-2q_a$.
Furthermore, by the XOR definition it follows that: $q_c = q_a q_b + (1-q_a)(1-q_b)$. Hence, by the above algebra it follows that $q_c(1-q_c) = \frac{1}{4}(1-\Delta_c^2)$, where $\Delta_c = 1-2q_c$.
In addition, by the definition of $q_c$, it may be shown that $\Delta_c = 1-2(2q_a q_b - q_a - q_b + 1) = -1 - 4q_a q_b + 2q_a + 2q_b = \Delta_a(-1+2q_b)$.

Hence, since $|-1+2q_b| \le 1$, it follows that $\Delta_c^2 \le \Delta_a^2$. So, Lemma 1 is obtained.

At any time-interval, the MUX-based MFPC may be considered a special case of the XOR-based MFPC. Hence the mathematical proof below of the XOR-based version holds for the MUX-based version.

Figure 6:
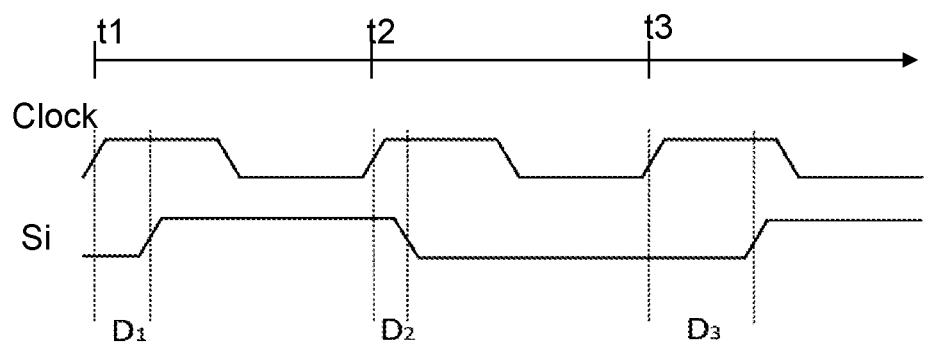
FIG. 6 shows a timing diagram of a signal delay for IC margin measurement and failure prediction.

Following are the results of simulation experiments:
Reference is now made to FIG. 6, which shows a timing diagram of a signal delay for IC failure prediction. Signal definition may be Di~U(Xi, Xi+di), and P{V(Si)=1, tj}=P{V(Si)=0, tj}=½. FIG. 6 shows an event-based simulation description, with simulation settings:
XOR1 was monitoring 256 input paths.
The data length of each path was $10^4$ clock cycles.
The cycle time of the clock was defined as 100 units of time.
A signal Si was generated for each path [i].
Each path [i], was defined by two constants [Xi] and [di] which determine the delay per each clock cycle.
[Xi] was drawn for each path by a uniform distribution between 25-50 units of time.
[di] was drawn for each path by a uniform distribution between 0-25 units of time.
For signal i, the switching time in each cycle was uniformly drawn in the range of (Xi, Xi+di).
The margin of signal i, is then [100−Xi−di].

The experiment was conducted for each value of D2, where D2 was defined in units of time, and the D2 delay value was swept in values at a resolution of needed to resolve separate timing delay margins in the signature, such as resolutions of fractions of the clock period times. For each D2 value, XOR2 output transitions may be counted, and the number of counts is plotted vs. the margin timing value threshold. The X-axis margin threshold may be 100-D2, and the Y-axis may be the number of [1]'s at the output of XOR2 observed for a certain value of D2:

XOR2=1 $iff$ XOR1($t$=100)≠XOR1($t$=D2).

Figure 7:
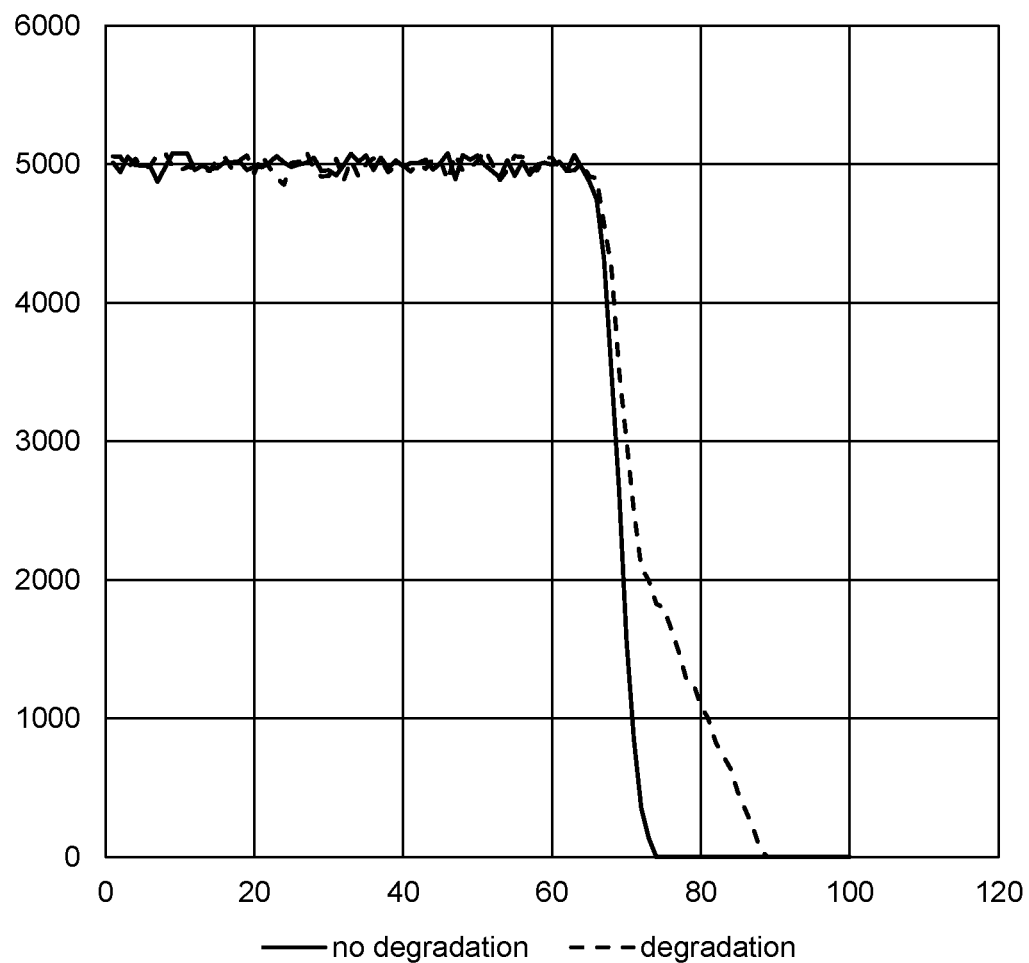
FIG. 7 shows a graph of errors versus cycle time for a first experiment.

Reference is now made to FIG. 7, which shows a graph of errors versus cycle time for a first experiment. The solid line represents the MFPC output at time-zero (without degradation), and the dashed line represents the MFPC output after degradation. The minimum margin was equal to 25 time units, such as [100−75], and MaxD2 at failure was 75 time units. In the degradation scenario the margin of one path was reduced by 15 time units (margin is distributed uniformly, and the max value was moved by 15 time units), the MFPC detects the change in the margin. Here the minimum margin was equal to 10 time units, such as [100−75-15], and MaxD2 at failure was 90 time units. The graph shows the counts at XOR2 output are gradually reduced to zero. For each D2 in the range of [75−90]:

P(XOR2=1)=P(change,delay>D2)=0.5*(90−(100−D2))/($di$+15).

Figure 8:
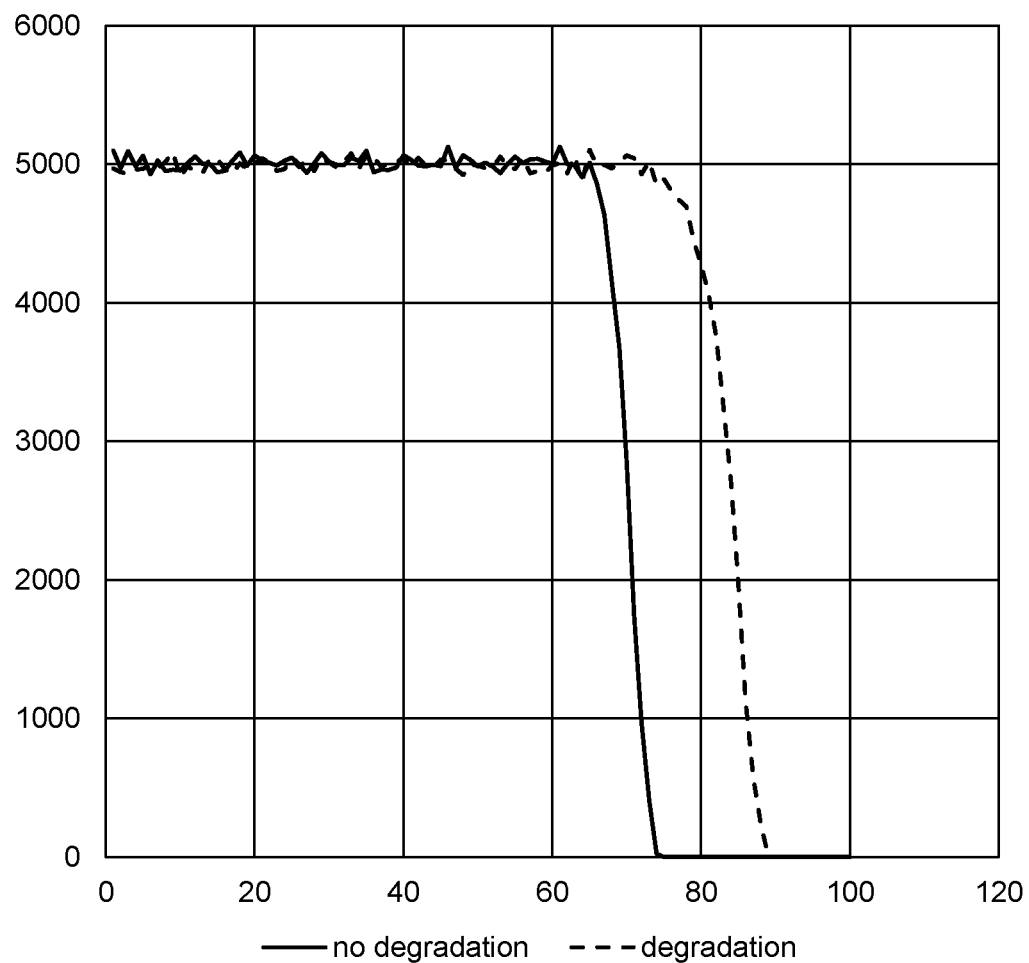
FIG. 8 shows a graph of errors versus cycle time for a second experiment.

Reference is now made to FIG. 8, which shows a graph of errors versus cycle time for a second experiment. The solid line represents the MFPC output at time-zero (no degradation), and the dashed line represent the MFPC output after degradation. The minimum margin of all the paths with [Xi+di>70] (margin<30) was increased by 15 time units, and this was performed for 5 signal paths. The minimum margin was equal to 25 time units, such as [100−75], and MaxD2 at failure was 75 time units. The MFPC detects the change in the margin, where the minimum margin was equal to 10 time units, such as [100−75-15], and MaxD2 at failure was 90 time units. The counts at XOR2 output are gradually reduced to zero. The probability of failure was increased with the number of paths.

Figure 9:
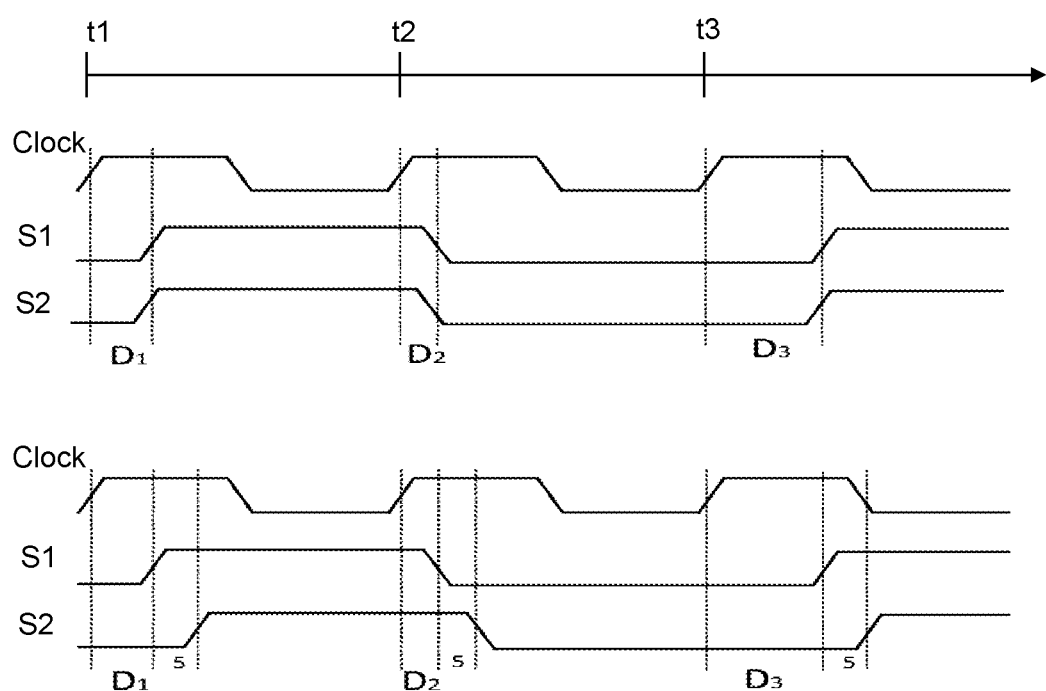
FIG. 9 shows a timing diagram of two signal delays for IC margin measurement and failure prediction.

Reference is now made to FIG. 9, which shows a timing diagram of two signal delays for IC failure prediction. The multiple signals are switched simultaneously, with equal delay and logic value at each cycle. The duplicate signals are implemented with the smallest margin. The maximum value of [Xi+di] is shown, where delay of the duplicated paths was increased by 15 time units. Both paths implement the same degradation.

Figure 10:
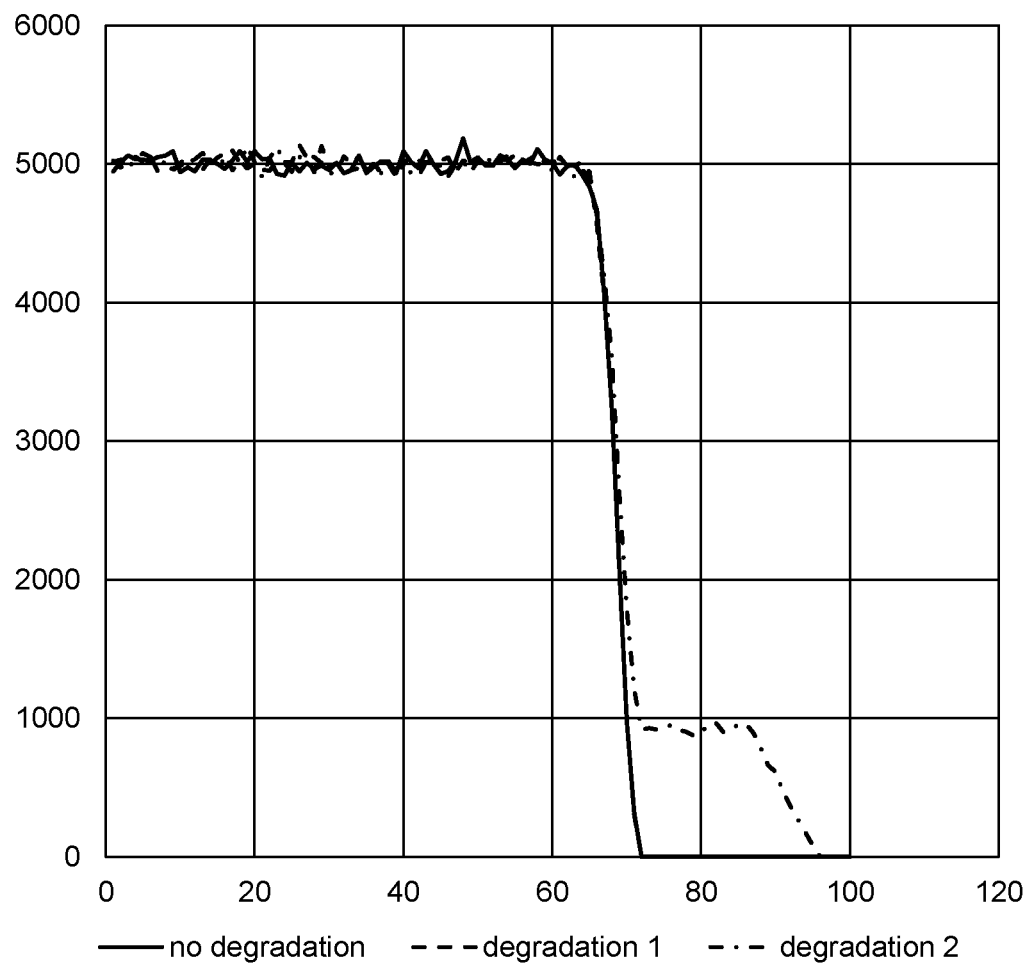
FIG. 10 shows a graph of errors versus cycle time for a third experiment.
Figure 11:
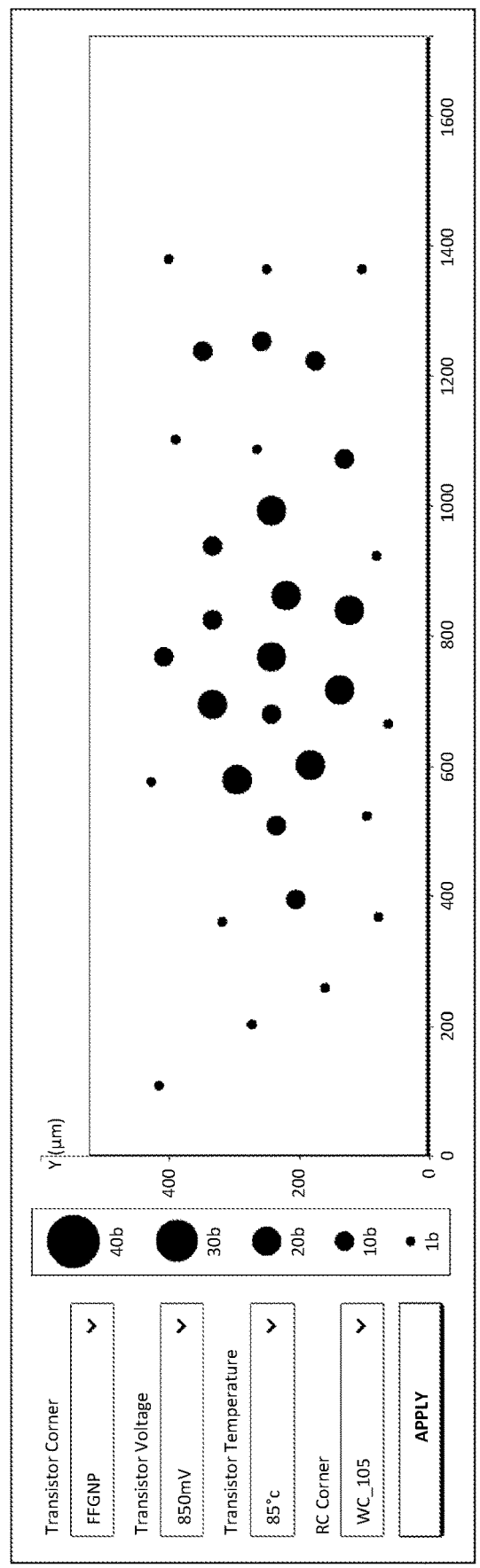
FIG. 11 shows a Margin-Map diagram of a unit.

Reference is now made to FIG. 10, which shows a graph of errors versus cycle time for a third experiment. The solid line represents no degradation, the dashed line (similar to the solid line) represents a first degradation scenario (FIG. 9 upper line), and the dot-dashed line represents a second degradation scenario in which the delay of one of the duplicated paths was increased by an additional 5 time units (FIG. 9 lower line). Note that the delays of the replica signal are smaller by 5 time units with respect to the base signal. The two paths are logically identical, but implement different timing degradations. The minimum margin was equal to 25 time units, such as [100−75]. In a first degradation scenario (dashed line), the system may not detect the change in the margin. MaxD2 at failure equals 75 time units for both scenarios. In a second degradation scenario (dot-dashed line), the system detects the change in the margin. MaxD2 at failure was 95 time units.

Figure 12:
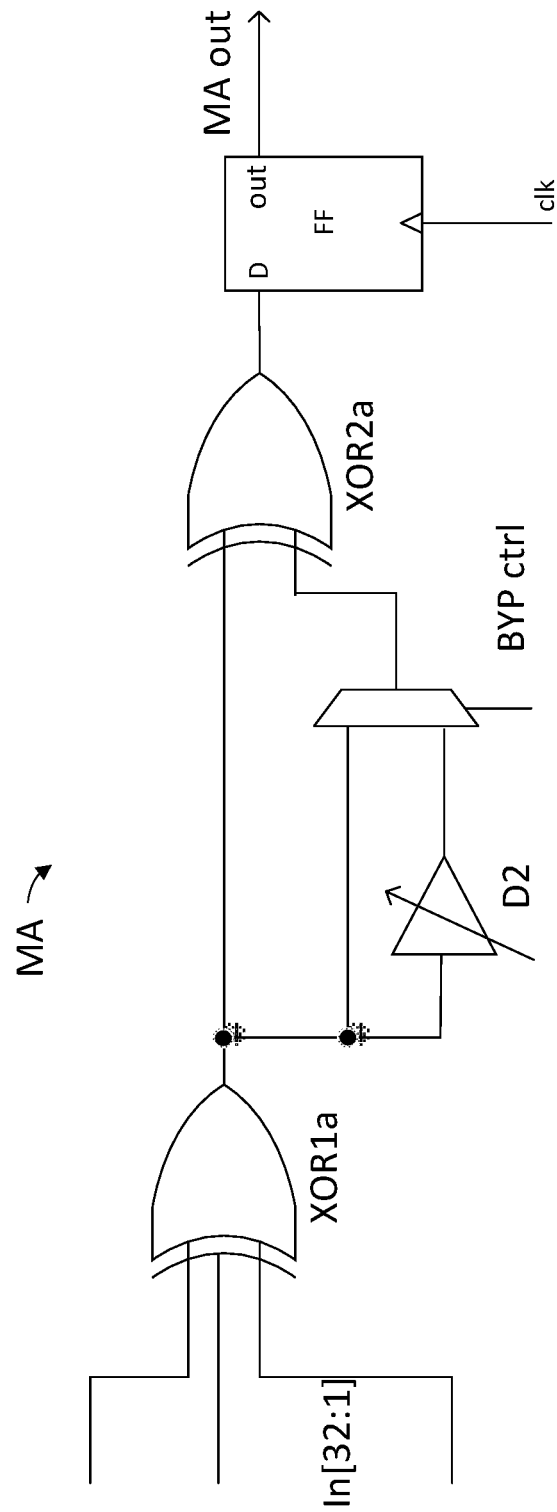
FIG. 12 shows a circuit diagram for a variant IC margin measurement agent.

Reference is now made to FIG. 12, which shows a circuit diagram for a variant IC margin measurement agent. This is similar to the IC margin measurement agent shown in FIG. 3B. It comprises a first XOR gate (XOR1$a$), which can receive a significant number of inputs (shown here with 32 inputs, but a smaller or larger number, such as between 2 and 1024, is also intended herein). In practice, the first XOR gate may comprise a large number of individual XOR gates coupled together to act together as a single XOR gate. The output from the first XOR gate is provided as a first input to a second XOR gate (XOR2$a$). The output from the first XOR gate is also provided to a configurable delay circuit (D2). In addition, the output from the first XOR gate and the output from the configurable delay circuit are provided as two inputs to a selector, which then provides the selected signal as a second input to the second XOR gate. The output of the second XOR gate is provided to a data register or flip-flop (FF).

Figure 13:
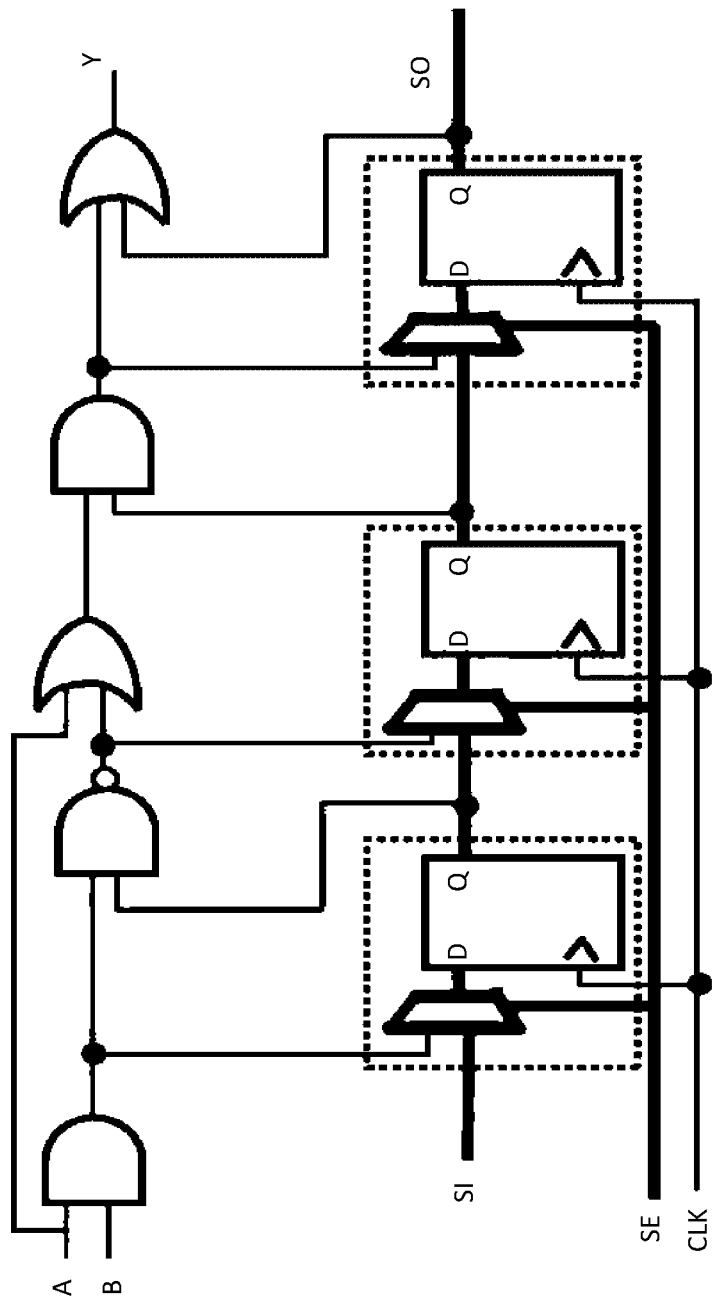
FIG. 13 shows a circuit diagram for a structural test scanning logic.

Reference is now made to FIG. 13, which shows a circuit diagram for a structural test scanning logic. Structural testing (sometime referred to as a "scan" test) is a testing approach that involves scanning test patterns into internal circuits within an IC—a Device Under Test (DUT). The state of the DUT's registers (flip-flops) is modified to allow them to function as stimulus and observation points, or "scan cells" during test, while performing their intended functional role during normal operation. This is shown by the "Scan Input" (SI) line, for receiving test patterns, the "Scan Enable" (SE) line for controlling the flow of the scanned test patterns into the registers and outputs from the registers, the clock (CLK) for controlling the scan synchronization, and the "Scan Output" (SO) line for taking the output off the IC for analysis.

The registers (scan cells) are linked together into "scan chains" that operate like a shift register when the circuit is configured into test mode (during the scan-in and scan-out processes). During the test mode, the scan chains are used to load a test pattern into the device. After the test pattern is loaded, the circuits are placed back into a functional mode and the test response is captured in one or more clock cycles (this is not normally governed by the clock signal controlling the register shift process, but rather a different clock signal of a higher frequency, not shown). At the next step, the circuit is again put in test mode and the captured test response (that is, the response or test output as stored in a register or registers within the IC) is shifted out, while the next test pattern is simultaneously shifted into the scan cells. The captured test response is compared with the expected response to identify mismatches that are likely the results of defects.

The test patterns are typically generated using Automatic Test Pattern Generation (ATPG) software tool, based on fault models. The fault models are defined to predict the expected behaviors (response) from the IC when defects are present. The ATPG tool then uses the fault models to determine the patterns required to detect those faults at all points (or high coverage) in the circuit. ATPG (or other similar tools) may include test compression, by using a small number of significant values to reduce test data and test time. There are a number of different fault models that are commonly used, as will now be discussed.

A "Stuck-At test" checks each node in the circuit for either stuck-at-1 or stuck-at-0 logic behavior.

An "At-speed-test" uses a dynamic fault model, i.e., it detects problems with respect to timing. There are two faults for every node location in the circuit, classified as slow-to-rise and slow-to-fall faults. The transition fault model uses a test pattern that creates a transition stimulus to change the logic value from either 0-to-1 or from 1-to-0. The time allowed for the transition is specified, so if the transition does not happen, or happens outside the allotted time, a timing defect is presumed.

A "Path-Delay-Test" uses a Path-Delay model, which is also dynamic fault model. This test is performed using "At-speed tests" on targeted timing critical paths. While "Stuck-At" tests and transition fault models usually address all the nodes in the circuit, the Path-Delay model only tests the exact paths specified by the designer based on the Static Timing Analysis (STA) results to determine the most critical paths.

A "Deterministic Bridging" test utilizes a combination of layout extraction tools and ATPG software. Based on a set of geometric rules, the extraction tool creates a list of net pairs that have the potential of Short-circuit due to bridging. This list is then fault simulated using existing stuck-at and transition patterns to determine which bridge defects can be detected. The net pairs that are not covered by the initial patterns are identified, and then used by the ATPG tool to generate a specific set of test patterns to completely validate that the remaining nets are not bridged.

In a "Small-Delay-Defects" test mode, circuit timing and physical layout information are used to guide the test generator to detect faults through the longest paths in order to improve the ability to detect small delay detects. The resulting patterns will have a much higher probability of catching small-delay defects if they are present.

To support the MA operation during structural test, the MA blocks are connected in a dedicated scan-chain. At test mode, the MA scan-chain is configured into Scan-shift (shift register scanning as discussed above) by the Scan-Enable signal (SE), which is used to enable Scan-Chain of the circuit block. When the circuit is placed back into capture mode (which mimics the functional mode), the MA will sample the worst-case (longest) path delay out of the paths that are combined (e.g., XORed) in the MA. Thus, in each "scan-in" of the IC, the testing scan data is shifted in each MA by the ATPG tool, which instructs each margin agent to make an incremental change to the variable delay.

After the capture, the MA scan-chain data (for example, pass or fail) will be shifted out. This is scanned out with the structural test data. Each scan pattern will shift-in a pre-defined value into the delay line register. The values of the scan pattern are not altered during the capture cycles. The delay line control and MA capture register (either the register itself or the repeater of this register) are part of the MA dedicated scan-chain and are driven separately from other scan-chains and are not part of the ATPG compression. A new scan pattern determines a new delay line value. The MA sample at the new data capture cycle reflects the worst-case delay related to the new delay line value, for instance as discussed above with reference to FIG. 3A, where the last rising or falling transitions of XOR1-output represents the minimal margin out of the combined paths. For a certain logic path (i) with a delay equal Di, the margin (M) for the path (i) is defined as $M_i = T_{cyc} - D_i$. The worst-case margin of a group of paths is defined as the minimum margin associated with all the paths in the group, that is M_min. If the delay line is configured to delay by X picoseconds (ps) and M_min>X, then the MA will report a failure. During multiple tests or patterns (exercising different delay line values (X)), the minimum value of X that causes an output fail is considered as the worst-case margin (the delay line value (X) is known and can be associated with the output fail). After enough results have been accumulated (by running the test pattern with different delay line delay configurations), the failure point (represented by the minimum delay-line delay at fail) for the specific test pattern measured by each MA can thus be pin-pointed as the worst-case margin.

Two modes of practical operation can be considered. In a characterization mode, for each specific test pattern, a structural test system running at an ATE (Automatic Test Equipment) generates the minimum margin associated with the paths connected to the MA. This also runs at Evaluation boards (which represent a real system environment). The minimum margin generated at the two different test environments is compared and used to correlate the two test platforms ("platform-to-platform correlation"). A High Volume Manufacturing (HVM) mode may instead be employed at the ATE. In this mode, the delay-line configuration is set to a constant value. The constant delay line value will be used as a threshold to screen slow dice from fast dice. More than one threshold can be used to increase screening granularity. The threshold and the specific test patterns may be determined at the characterization stage.

It should be noted that even with a MA having only 32 inputs (as shown in FIG. 12), the number of possible logic positions is $2^{32}$, which is a very large number. Testing the worst-case margin over all possible logic positions is not normally feasible in a reasonable time frame, but a large number of different logic positions can be tested using ATPG test patterns. This may be achieved using an XOR-based circuit for combining signal paths, for example as shown in FIG. 3A and discussed further above.

In a general sense, there may be considered a method for testing a semiconductor IC. A structural test is performed on the semiconductor IC, by scanning test patterns into internal circuits of the semiconductor IC. A margin is measured during the structural test. The margin is measured based on a characteristic of a comparison between a test signal path of the semiconductor IC and a delayed signal path, the delayed signal path being a signal of the test signal path delayed by a variable delay time. The introduced delay is advantageous incremented with each structural test pattern scanned into the internal circuits. The margin is then beneficially determined from (or based on) the delay value which prevented the delayed data from successfully propagating within a single clock cycle. For example, this is as discussed at least with reference to FIG. 1 and FIG. 2 above. Optionally, the comparison output is provided in a comparison data signal to at least one mitigation circuit. This may provide a FPC or MFPC as discussed above. The margin measurement is optionally performed by a sensor on the semiconductor IC forming part of the internal circuits of the semiconductor IC used for the structural test.

In another general sense, there may be considered a method for testing a semiconductor IC. The method comprises: scanning test patterns into internal circuits of the semiconductor IC (the test patterns may, in particular, be for performing a structural test on the semiconductor IC), the internal circuits of the semiconductor IC comprising a margin measurement sensor; measuring a margin, using the margin measurement sensor, the margin comprising a characteristic of a comparison between a test signal path of the semiconductor IC and a delayed signal path, the delayed signal path being a signal of the test signal path delayed by a variable delay time; and scanning out an output of the margin measurement sensor.

In a further general sense, there may be considered a method for testing a semiconductor IC comprising: scanning a test condition into a margin measurement sensor forming part of internal circuits of the semiconductor IC; and measuring, at the margin measurement sensor during an operational mode of functional circuits of the semiconductor IC (the operational made may be, for example, a capture mode of a structural test), one or more margins. Each margin is measured based on a characteristic of a comparison between a test signal path of the semiconductor IC and a delayed signal path, the delayed signal path being a signal of the test signal path delayed by a variable delay time.

In an additional general sense, a method for testing a semiconductor IC using a separate tester device (namely, separate from the IC itself) may be considered. The method comprises: scanning a test condition from the tester device into a margin measurement sensor forming part of internal circuits of the semiconductor IC; and receiving at the tester device from the margin measurement sensor one or more margins, each margin being measured based on a characteristic of a comparison between a test signal path of the semiconductor IC and a delayed signal path, the delayed signal path being a signal of the test signal path delayed by a variable delay time.

In additional general senses, there may be provided a semiconductor IC comprising: structural test circuitry, for receiving test patterns and running one or more structural tests on functional circuitry of the semiconductor IC; and a margin measurement sensor, configured to measure a margin, the margin comprising a characteristic of a comparison between a test signal path of the semiconductor IC and a delayed signal path, the delayed signal path being a signal of the test signal path delayed by a variable delay time.

A number of optional and/or advantageous features may be considered in association with any of these general senses. The characteristic of a comparison (the margin or data from which the margin may be derived) may comprise one or more of: a pass or fail condition; a delay threshold comparison result; a delay indication; and a worst case delay indication. The structural test may comprise one or more of: a Stuck-At test; an At-Speed test; a Path-Delay test; a Deterministic Bridging test; and a Small-Delay-Defects test.

In these ways, an IC may incorporate one or more embedded margin agents and a margin of the fabricated IC with respect to a certain test pattern may be determined at each of the embedded margin agents. A structural test may be formulated (for instance, by suitable programming of the ATPG tool) such that, with each test pattern loaded onto the IC, the delay introduced by each of the margin agents may be slightly adjusted. Upon reading the results of multiple such test patterns, pass or fail outputs of the margin agents may be provided as outputs. By identifying the delay value that caused each margin agent to move from a "pass" state to a "fail" state, the margin at that margin agent may be identified. In other words, the step of measuring the margin identified above may be comprise identifying a delay time threshold based on multiple comparisons between the test signal path of the semiconductor IC and the delayed signal path for different delay times. Each repetition in this case is for a different delay time. Thus, the delay time threshold may be a delay time for which a result of the comparison changes from state to another state (the "pass" or "fail" state indicated above).

An incremental adjustment of the variable delay time during structural testing may thereby allow inference of the true physical delay in the IC.

As discussed above, the margin measurement sensor or agent may receive a plurality of signal paths of the semiconductor IC, for instance at least 16 or 32 (although 64 and 128 may also be possible, as are other values in between or even larger than 128). In this case, it may combine the received plurality of signal paths of the semiconductor IC to provide the test signal path. In other words, a step of measuring may comprise receiving, at a signal path combiner, the plurality of signal paths of the semiconductor IC; and combining the received plurality of signal paths of the semiconductor IC to provide the test signal path.

The test patterns are optionally generated using Automatic Test Pattern Generation (ATPG). In embodiments, the methods may further comprise scanning out the output of the margin measurement sensor using a ATPG shift mode.

Scanning into the internal circuits of the semiconductor IC may be controlled by a scan clock having a first frequency. An operation of the semiconductor IC, during which the (margin) measuring is performed, may be controlled by a capture clock having a second frequency that is higher than the first frequency. The scan clock may be external to the semiconductor IC.

In embodiments, a number of operating modes may be considered. In a characterization mode, a minimum margin associated with one or more signal paths coupled to the margin measurement sensor may be determined for each of a plurality of structural test patterns. This is performed at each of an Automatic Test Equipment and an Evaluation Board (each being considered a platform). The determined minimum margins for each of the Automatic Test Equipment and the Evaluation Board are compared. A performance of the Automatic Test Equipment and the Evaluation Board may thereby be correlated based on the step of comparing. In HVM mode, the variable delay time for the margin measurement sensor may be set to a threshold value (which is advantageously kept the same for all test patterns and/or ICs). Each IC may be classified (according to its speed) based the measured margin using the threshold value. Optionally, more than one threshold value may be used, for example to allow more than two levels of granularity in classification.

In other general senses, there may be considered a computer program product for testing a semiconductor IC, comprising: a scanning module, for scanning a test condition into a margin measurement sensor forming part of internal circuits of the semiconductor IC; and a measurement module, for controlling the margin measurement sensor to measure one or more margins, each margin being measured based a characteristic of a comparison between a test signal path of the semiconductor IC and a delayed signal path, the delayed signal path being a signal of the test signal path delayed by a variable delay time. This may have any features associated with other general senses herein.

Figure 14:
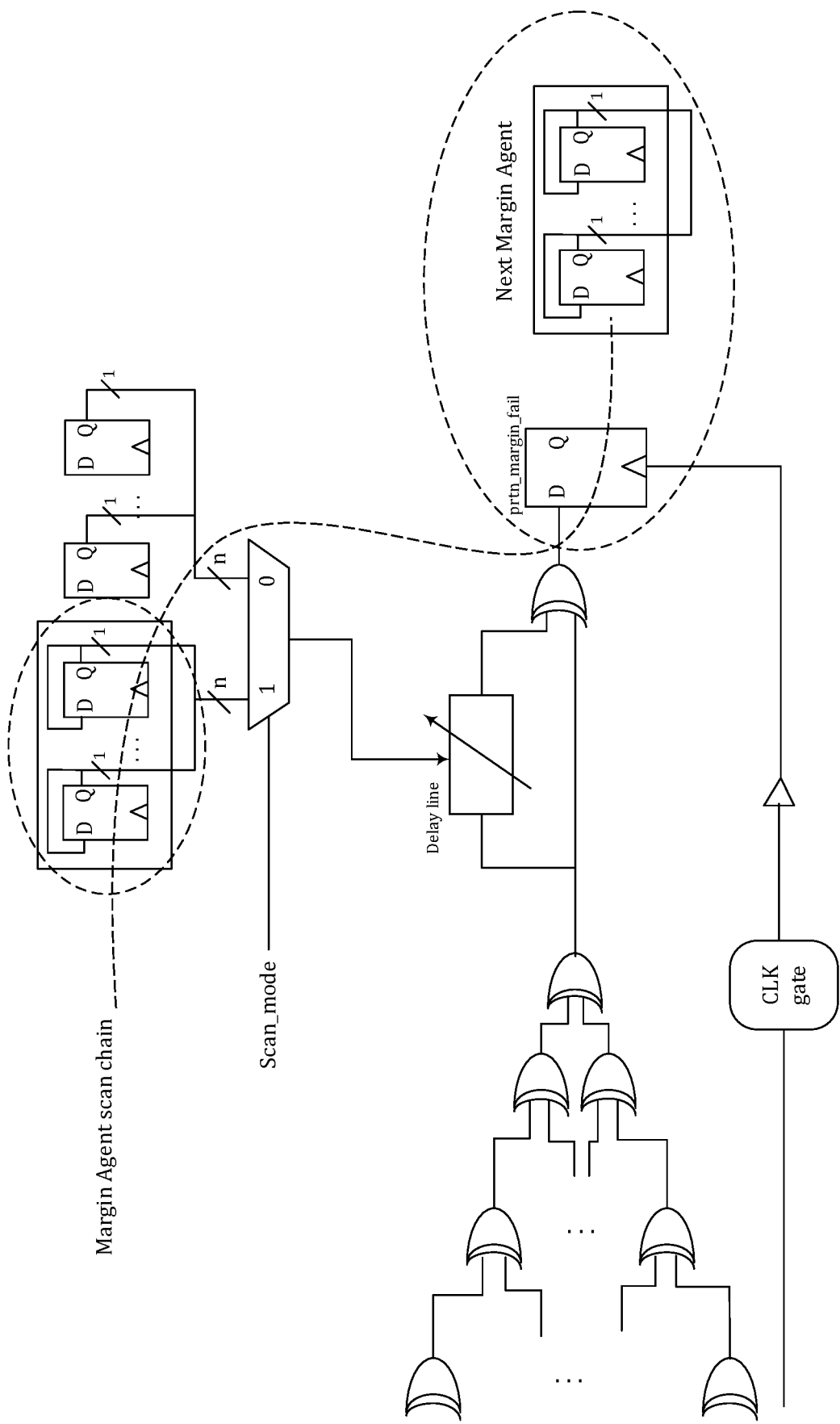
FIG. 14 shows a first configuration of an IC margin measurement agent for use during structural tests.

Reference is now made to FIG. 14, which shows a first configuration of an IC margin measurement agent for use during structural tests. The registers coupled through the scan chain are circled with dashed lines, and the scan chain is indicated by another dashed line connecting these registers. In this configuration, the MA scan chain comprises the MA sampling register. During scan-shift the Margin fail register output is set to zero by the shift-in test pattern. During capture of "at-speed" test cycles, the Margin fail register will store the worst-case margin of the destination registers connected to the MA, if the margin is less than the delay-line configured margin. As discussed above with reference to FIG. 3A, for example, if the delay line is configured to X ps, and M_min>X then the MA will report a failure (that is, its output will rise to logic '1'). During multiple tests or patterns (exercising different delay line values (X)), the minimum value of X causing an output fail is considered as the worst-case margin (the delay line value (X) is known and can be associated with the output fail).

Figure 15:
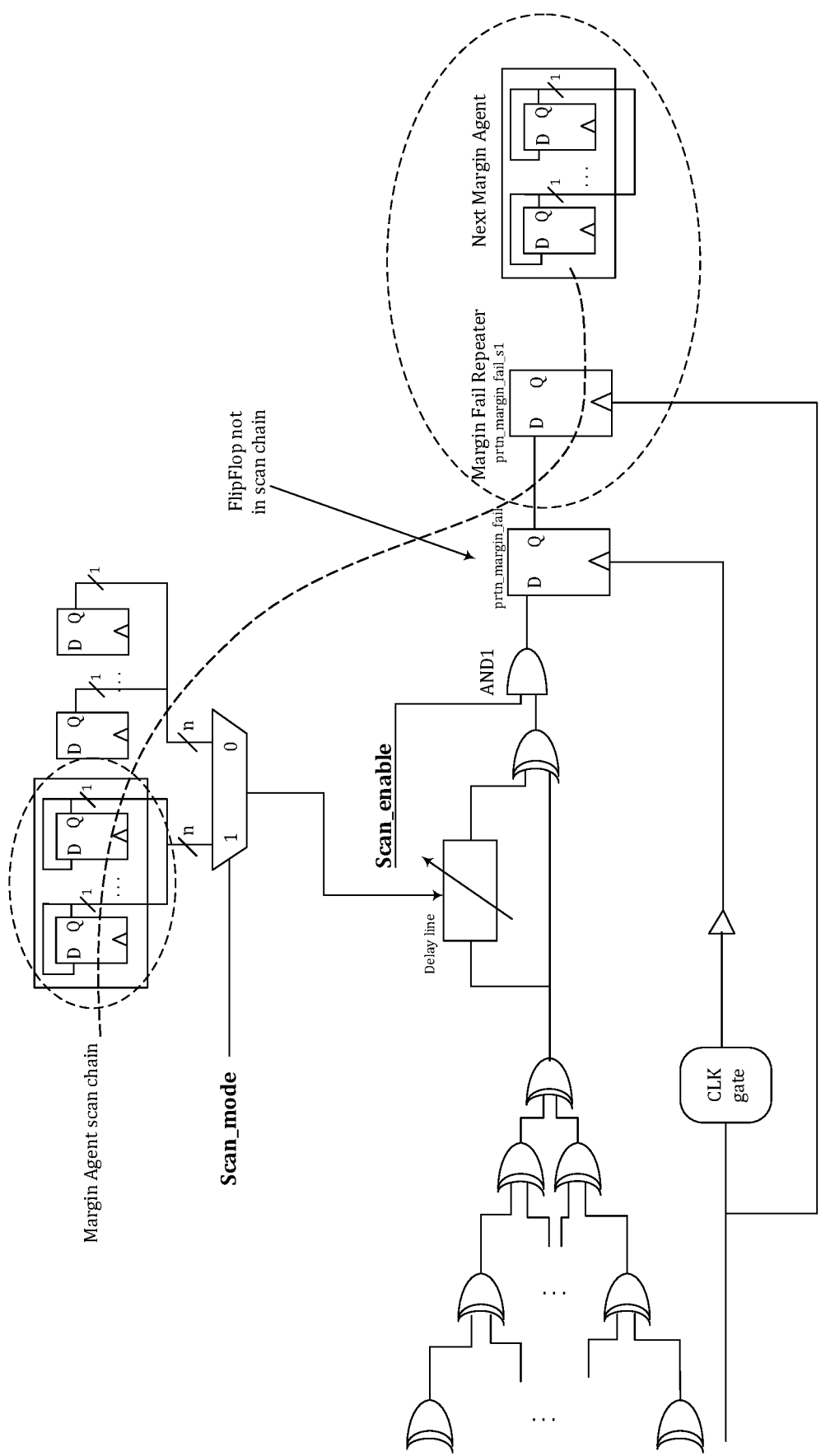
FIG. 15 shows a second configuration of an IC margin measurement agent for use during structural tests.

Reference is now made to FIG. 15, which shows a second configuration of an IC margin measurement agent for use during structural tests. In this alternative configuration, the MA sampling register is not part of the scan chain, but rather the scan chain includes a MA repeater register. During scan-shift, the repeater register output is set to zero by the AND gate (AND1) and setting the "Scan Enable" (SE) signal to zero. During capture of "at-speed" test cycles, the Margin fail register will store the worst-case margin of the destination registers connected to the MA, if the margin is less than the delay line configured margin. The Margin fail register is a non-scan register and excluded from the scan chain, which can provide better accuracy in the margin measurement, but requires additional capture clock cycles (to make sure that the MA sampling register value, margin_fail_reg, is sampled by repeater register).

With reference to the general terms indicated above, a method may comprise scanning out data on the measured margin from the internal circuits of the semiconductor IC used for the structural test. Optionally, the data on the measured margin is scanned out of the internal circuits of the semiconductor IC used for the structural test separately from other data resulting from the structural test.

If the margin agent is formed as a sensor, it may comprise a data register forming part of a scan chain of the structural test. Then, the method may further comprise: configuring the structural test by resetting the data register; storing the measured characteristic of a delay in the data register; and scanning out the measured characteristic of a delay from the data register.

In one embodiment, the data register forming part of a scan chain of the structural test is a first data register at the output of the sensor and the data register is reset to configure the structural test by scanning in a reset pattern. Alternatively, the data register forming part of a scan chain of the structural test may be a second data register that receives the measured characteristic of a delay from a first data register at the output of the sensor and the second data register is reset to configure the structural test by an output of the first data register.

Figure 16:
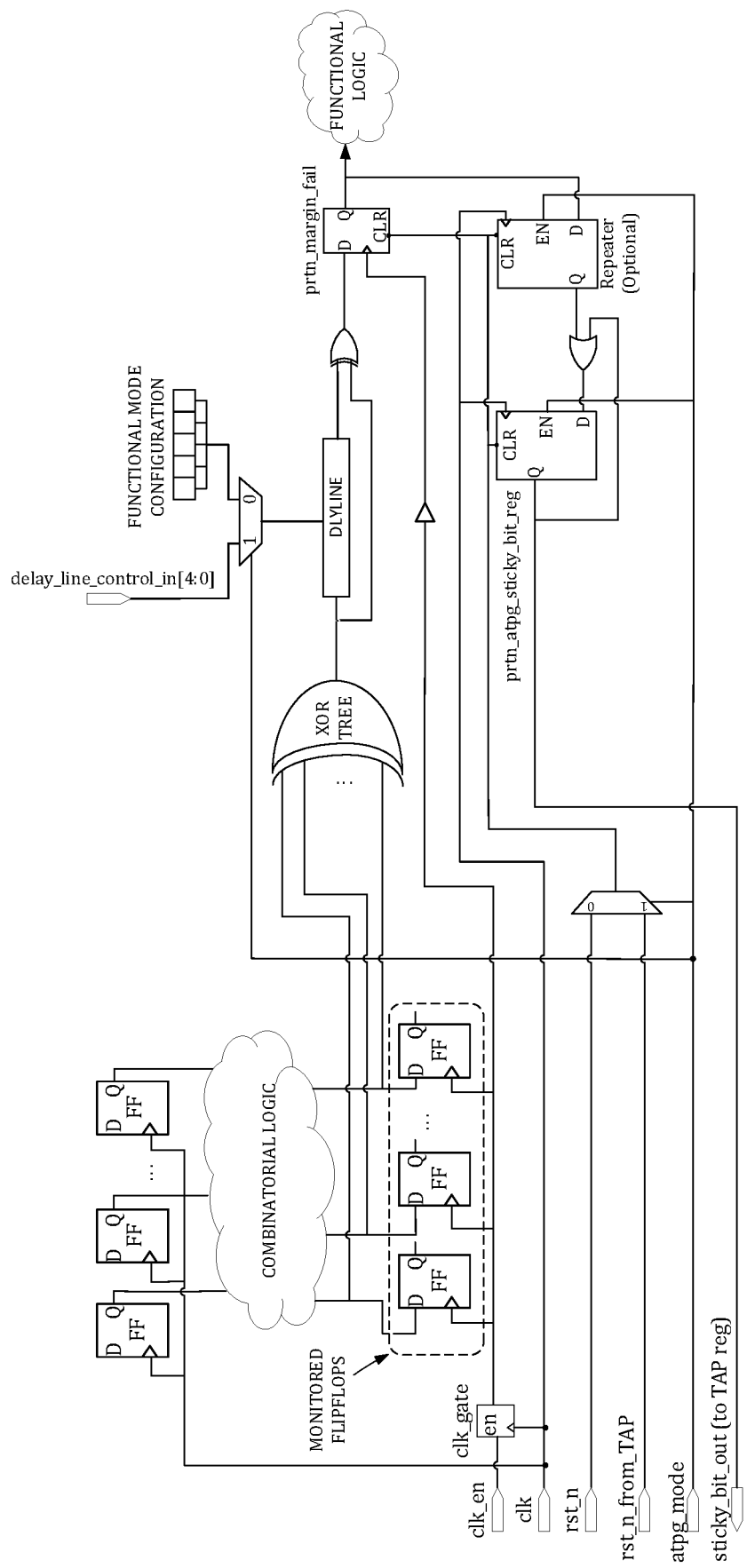
FIG. 16 shows a first schematic configuration of an IC margin measurement agent using asynchronous reset and a Test Access Port (TAP) interface.

Reference is now made to FIG. 16, which shows a first schematic configuration of an IC margin measurement agent using asynchronous reset and a Test Access Port (TAP) interface. In this implementation, the Margin fail Register is not a part of the dedicated scan chain (for instance, as discussed with reference to FIG. 15 above). The delay configuration register is part of a TAP register that may be controlled by the JTAG interface. An advantage of this approach is that there is no need to change the ATPG patterns. As discussed below, an additional register and an OR gate (which are not part of the scan chain) are used to store the margin fail indication, by generating a "sticky bit" indication.

FIG. 16 further describes connectivity of a MA for structural testing. In this configuration, outputs from the combinatorial logic of the IC are provided to registers (monitored FFs), clocked by a clock signal (clk) that is controlled by a clock enable signal (clk_en) using a register (clk_gate). The outputs of the registers are combined using an XOR tree (as discussed above, for example with reference to FIG. 3A) and the margin is measured by comparing the output of the XOR tree with a parallel path delayed by a variable delay line (DLYLINE). The variable delay line is controlled by a TAP interface. The output of the margin agent is provided to an output register (prtn_margin_fail), with an optional repeater register (as discussed with reference to FIG. 15 above). These outputs are then passed to functional logic, representing the MA controller that measures the margin in non-ATPG mode. A further register (prtn_atpg_sticky_bit, circled) coupled to the output is used as an accumulator for the MA run result, allows running on multiple ATPG patterns without this register being reset between them. Before running any ATPG pattern, all registers in the scan chain, including the optional repeater register are desirably reset.

Figure 17:
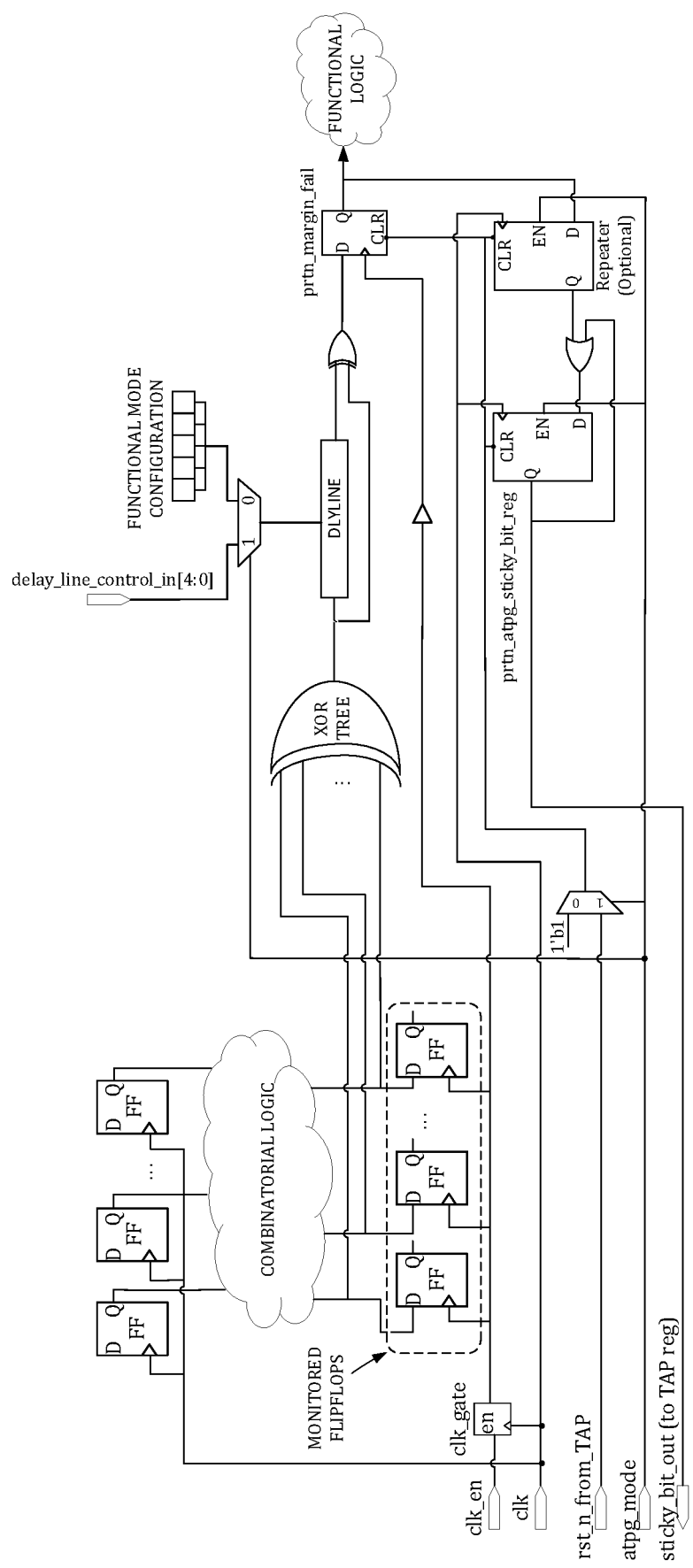
FIG. 17 shows a second schematic configuration of an IC margin measurement agent using synchronous reset and a TAP interface.

Reference is now made to FIG. 17, which shows a second schematic configuration of an IC margin measurement agent using synchronous reset and a TAP interface. The functionality is the same as described with reference to FIG. 17. The choice between asynchronous and synchronous reset may be an IC designer preference.

Figure 18:
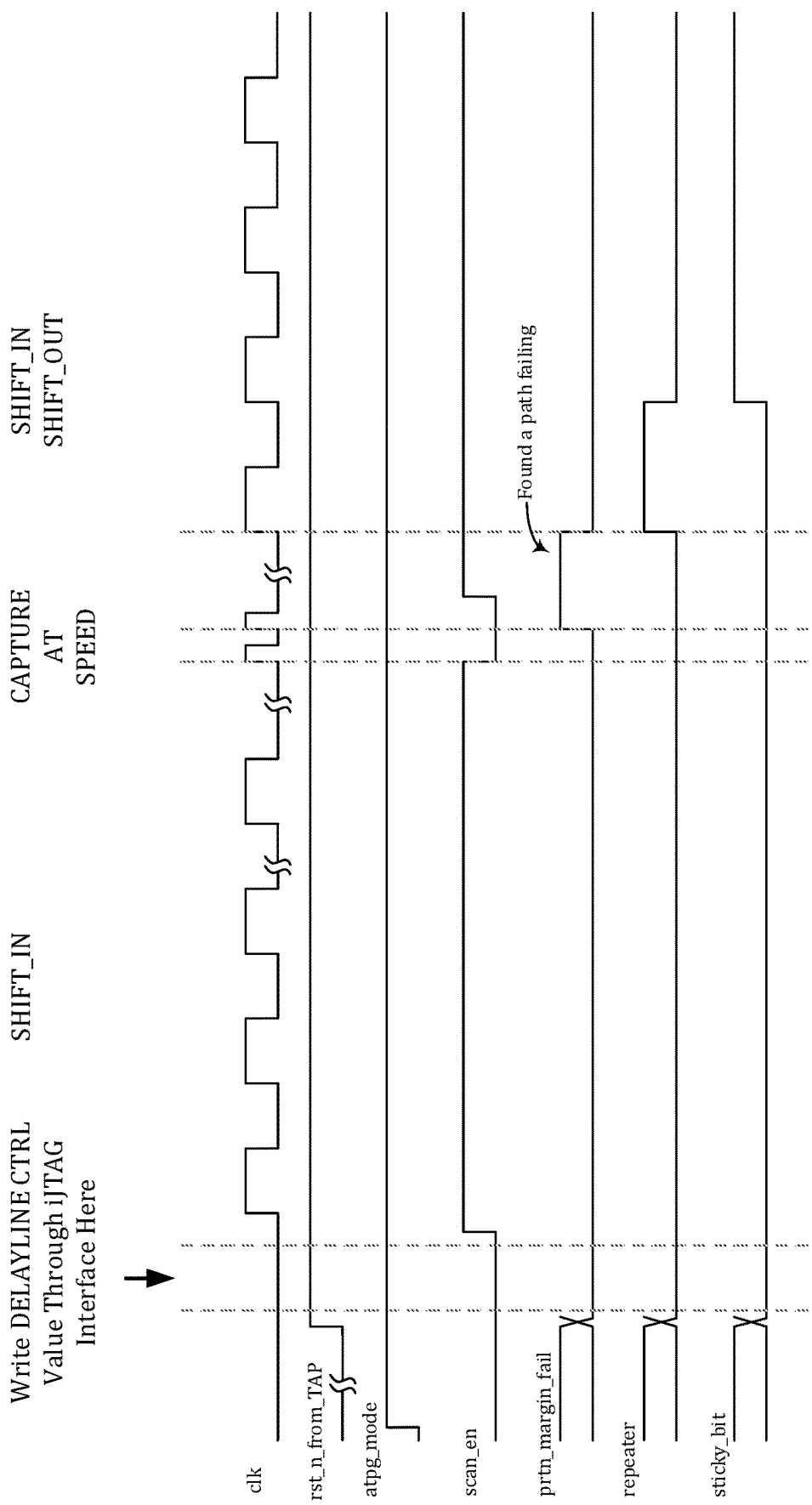
FIG. 18 shows waveform diagrams of the IC margin measurement agent using asynchronous reset and a TAP interface.

Reference is then made to FIG. 18, which shows waveform diagrams of the IC margin measurement agent using asynchronous reset and a TAP interface. This drawing describes the waveforms of the signals generated by the schematic configuration of FIGS. 16 and 17, including the relative behavior of signals.

It should be noted that a measured margin may be indicated, displayed, and/or communicated to a computer system external to the IC (and/or to a user) in various formats. The most straightforward way to indicate the margin is to provide it as a time value, e.g. X nanoseconds, picoseconds, or the like. Another way to provide it as a frequency value, e.g. Y MHz or GHz, which expresses how much faster the IC's clock can run without causing failure. For example, if the IC's normal clock frequency is 2 GHz and the measured delay which triggered a failure was 0.05 nanoseconds, then the margin can be expressed as 200 MHz; namely, the IC can probably be over-clocked up to about 2.2 GHz without causing failure. A further way to provide the measured margin is as a percentage of the IC's normal clock frequency; continuing upon the previous example of a 2 GHz normal frequency and a 0.05 nanosecond margin, that margin can be expressed as 10% of the IC's normal frequency.

In addition to these three exemplary options for expressing the margin, it may also be useful to indicate, display, and/or communicate the designed margin value for the pertinent data path(s). For example, if these paths were designed, at Pre-Si, to have a margin of 0.02 nanoseconds but it turns out the measured margin is only 0.01 nanoseconds, it tells the user that either something unexpected occurred during fabrication of the IC, or the design was somehow flawed. An opposite example if when the measured margin is actually larger than the designed margin; this indicates that the design was probably overly cautious and that the pertinent paths could have been designed in a way which preserves material and reduces costs.

Throughout this application, various embodiments of this invention may be presented in a range format. It should be understood that the description in range format is merely for convenience and brevity and should not be construed as an inflexible limitation on the scope of the invention. Accordingly, the description of a range should be considered to have specifically disclosed all the possible subranges as well as individual numerical values within that range. For example, description of a range such as from 1 to 6 should be considered to have specifically disclosed subranges such as from 1 to 3, from 1 to 4, from 1 to 5, from 2 to 4, from 2 to 6, from 3 to 6 etc., as well as individual numbers within that range, for example, 1, 2, 3, 4, 5, and 6. This applies regardless of the breadth of the range.

Whenever a numerical range is indicated herein, it is meant to include any cited numeral (fractional or integral) within the indicated range. The phrases "ranging/ranges between" a first indicate number and a second indicate number and "ranging/ranges from" a first indicate number "to" a second indicate number are used herein interchangeably and are meant to include the first and second indicated numbers and all the fractional and integral numerals therebetween.

In the description and claims of the application, each of the words "comprise" "include" and "have", and forms thereof, are not necessarily limited to members in a list with which the words may be associated. In addition, where there are inconsistencies between this application and any document incorporated by reference, it is hereby intended that the present application controls.

To clarify the references in this disclosure, it is noted that the use of nouns as common nouns, proper nouns, named nouns, and the/or like is not intended to imply that embodiments of the invention are limited to a single embodiment, and many configurations of the disclosed components can be used to describe some embodiments of the invention, while other configurations may be derived from these embodiments in different configurations.

In the interest of clarity, not all of the routine features of the implementations described herein are shown and described. It should, of course, be appreciated that in the development of any such actual implementation, numerous implementation-specific decisions must be made in order to achieve the developer's specific goals, such as compliance with application- and business-related constraints, and that these specific goals will vary from one implementation to another and from one developer to another. Moreover, it will be appreciated that such a development effort might be complex and time-consuming, but would nevertheless be a routine undertaking of engineering for those of ordinary skill in the art having the benefit of this disclosure.

Based upon the teachings of this disclosure, it is expected that one of ordinary skill in the art will be readily able to practice the present invention. The descriptions of the various embodiments provided herein are believed to provide ample insight and details of the present invention to enable one of ordinary skill to practice the invention. Moreover, the various features and embodiments of the invention described above are specifically contemplated to be used alone as well as in various combinations.

Conventional and/or contemporary circuit design and layout tools may be used to implement the invention. The specific embodiments described herein, and in particular the various thicknesses and compositions of various layers, are illustrative of exemplary embodiments, and should not be viewed as limiting the invention to such specific implementation choices. Accordingly, plural instances may be provided for components described herein as a single instance.

While circuits and physical structures are generally presumed, it is well recognized that in modern semiconductor design and fabrication, physical structures and circuits may be embodied in computer readable descriptive form suitable for use in subsequent design, test or fabrication stages as well as in resultant fabricated semiconductor integrated circuits. Accordingly, claims directed to traditional circuits or structures may, consistent with particular language thereof, read upon computer readable encodings and representations of same, whether embodied in media or combined with suitable reader facilities to allow fabrication, test, or design refinement of the corresponding circuits and/or structures. Structures and functionality presented as discrete components in the exemplary configurations may be implemented as a combined structure or component. The invention is contemplated to include circuits, systems of circuits, related methods, and computer-readable medium encodings of such circuits, systems, and methods, all as described herein, and as defined in the appended claims. As used herein, a computer readable medium includes at least disk, tape, or other magnetic, optical, semiconductor (e.g., flash memory cards, ROM), or electronic medium and a network, wireline, wireless or other communications medium.

The foregoing detailed description has described only a few of the many possible implementations of the present invention. For this reason, this detailed description is intended by way of illustration, and not by way of limitations. Variations and modifications of the embodiments disclosed herein may be made based on the description set forth herein, without departing from the scope and spirit of the invention. It is only the following claims, including all equivalents, which are intended to define the scope of this invention. In particular, even though the preferred embodiments are described in the context of one of a number of specific circuit designs for a semiconductor IC, the teachings of the present invention are believed advantageous for use with other types of semiconductor IC circuitry. Moreover, the techniques described herein may also be applied to other types of circuit applications. Accordingly, other variations, modifications, additions, and improvements may fall within the scope of the invention as defined in the claims that follow.

Embodiments of the present invention may be used to fabricate, produce, and/or assemble integrated circuits and/or products based on integrated circuits.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. Combinations of features and/or aspects as disclosed herein are also possible, even between different embodiments of FPC or MFPC or other designs and/or drawings of other features. The terminology used herein was chosen to best explain the principles of the embodiments, the practical application, or technical improvement over technologies found in the marketplace, or to enable others of ordinary skill in the art to understand the embodiments disclosed herein.

What is claimed is:

1. A method for testing a semiconductor integrated circuit (IC), the method comprising:
   scanning test patterns into internal circuits of the semiconductor IC, the internal circuits of the semiconductor IC comprising a margin measurement sensor;
   measuring a margin, using the margin measurement sensor, the margin being measured based on a characteristic of a comparison between a test signal path of the semiconductor IC and a delayed signal path, the delayed signal path being a signal of the test signal path delayed by an adjustable delay time,
   wherein the adjustable delay time is introduced by having each of the test patterns cause an incremental adjustment of the delay time; and
   scanning out an output of the margin measurement sensor.

2. The method of claim 1, wherein the step of measuring comprises:
   receiving, at a signal path combiner, a plurality of signal paths of the semiconductor IC; and
   combining the received plurality of signal paths of the semiconductor IC to provide the test signal path.

3. The method of claim 1, wherein the step of measuring the margin comprises identifying a delay time threshold based on multiple comparisons between the test signal path of the semiconductor IC and the delayed signal path for different delay times.

4. The method of claim 1, wherein the method constitutes a structural test of the semiconductor IC, and wherein the margin measurement sensor comprises a data register forming part of a scan chain of the structural test, the method further comprising:
   configuring the structural test by resetting the data register;
   storing the measured characteristic of the delay in the data register; and
   wherein the scanning out comprises scanning out the measured characteristic of a delay from the data register.

5. The method of claim 4, wherein:
   the data register is a first data register at the output of the margin measurement sensor, and the first data register is reset to configure the structural test by scanning in a reset pattern; or
   the data register is a second data register that receives the measured characteristic of a delay from a first data register at the output of the margin measurement sensor, and the second data register is reset to configure the structural test by an output of the first data register.

6. The method of claim 1, wherein the test patterns are generated using Automatic Test Pattern Generation (ATPG), and wherein the scanning out is performed using an ATPG shift mode.

7. The method of claim 1, wherein the characteristic of a comparison comprises one or more of: a pass or fail condition; a delay threshold comparison result; a delay indication; and or a worst case delay indication.

8. The method of claim 1, wherein the scanning of test patterns into the internal circuits of the semiconductor IC is controlled by a scan clock having a first frequency; and wherein an operation of the semiconductor IC, during which the measuring of the margin is performed, is controlled by a capture clock having a second frequency that is higher than the first frequency.

9. The method of claim 1, further comprising operating in a characterization mode, in which:
   the measuring of the margin comprises determining a minimum margin associated with one or more signal paths coupled to the margin measurement sensor for each of a plurality of structural test patterns at each of an Automatic Test Equipment and an Evaluation Board;
   the determined minimum margin for each of the Automatic Test Equipment and the Evaluation Board is compared; and
   performance of Automatic Test Equipment and the Evaluation Board is correlated.

10. The method of claim 1, further comprising operating in High Volume Manufacturing (HVM) mode, by setting the variable delay time for the margin measurement sensor to a threshold value and classifying the IC based the measured margin using the threshold value.

11. A tester device configured to test a semiconductor integrated circuit (IC) by:
    scanning test patterns from the tester device into a margin measurement sensor forming part of internal circuits of the semiconductor IC; and
    scanning out an output of the margin measurement sensor from the semiconductor IC to the tester device, to receive at the tester device one or more margin measurements performed by the margin measurement sensor, each margin being measured based on a characteristic of a comparison between a test signal path of the semiconductor IC and a delayed signal path of the semiconductor IC, the delayed signal path being a signal of the test signal path delayed by an adjustable delay time, wherein the adjustable delay time is introduced by having each of the test patterns cause an incremental adjustment of the delay time.

12. The tester device of claim 11, wherein the characteristic of the comparison comprises one or more of: a pass or fail condition; a delay threshold comparison result; a delay indication; or a worst case delay indication.

13. The tester device of claim 11, wherein each of the one or more margin measurements is performed by:
    receiving, at a signal path combiner of the semiconductor IC, a plurality of signal paths of the semiconductor IC; and
    combining the received plurality of signal paths of the semiconductor IC to provide the test signal path.

14. The tester device of claim 11, wherein each of the one or more margin measurements is performed by identifying a delay time threshold based on multiple comparisons between the test signal path of the semiconductor IC and the delayed signal path for different delay times.

15. A semiconductor integrated circuit (IC), comprising:
    structural test circuitry configured to receive test patterns and to run one or more structural tests on functional circuitry of the semiconductor IC; and
    a margin measurement sensor configured to measure a margin, the margin comprising a characteristic of a comparison between a test signal path of the semiconductor IC and a delayed signal path, the delayed signal path being a signal of the test signal path delayed by an adjustable delay time, wherein the adjustable delay time is introduced by having each of the test patterns cause an incremental adjustment of the delay time.

16. The semiconductor IC of claim 15, wherein the characteristic of the comparison comprises one or more of: a pass or fail condition, a delay threshold comparison result, a delay indication, or a worst case delay indication.

17. The semiconductor IC of claim 15, wherein the measuring of the margin comprises identifying a delay time threshold based on multiple comparisons between the test signal path of the semiconductor IC and the delayed signal path for different delay times.

18. The semiconductor IC of claim 15, wherein the margin measurement sensor comprises a data register forming part of a scan chain of the one or more structural tests, and wherein the one or more structural tests comprise:
- configuring the respective structural test by resetting the data register;
- storing the measured characteristic of the delay in the data register; and
- scanning out the measured characteristic of the delay from the data register.

19. The semiconductor IC of claim 18, wherein the data register is a first data register at the output of the margin measurement sensor, and the first data register is reset to configure the structural test by scanning in a reset pattern.

20. The semiconductor IC of claim 18, wherein the data register is a second data register that receives the measured characteristic of the delay from a first data register at the output of the margin measurement sensor, and the second data register is reset to configure the structural test by an output of the first data register.

* * * * *